US012245484B2

(12) United States Patent
Wang

(10) Patent No.: US 12,245,484 B2
(45) Date of Patent: Mar. 4, 2025

(54) DISPLAY MODULE AND DISPLAY DEVICE

(71) Applicant: Wuhan Tianma Micro-Electronics Co., Ltd., Wuhan (CN)

(72) Inventor: Junqiang Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 736 days.

(21) Appl. No.: 17/450,929

(22) Filed: Oct. 14, 2021

(65) Prior Publication Data

US 2023/0006002 A1    Jan. 5, 2023

(30) Foreign Application Priority Data

Jun. 30, 2021    (CN) .......................... 202110742836.9

(51) Int. Cl.
*H10K 59/80* (2023.01)
*H10K 59/35* (2023.01)

(52) U.S. Cl.
CPC ......... *H10K 59/353* (2023.02); *H10K 59/352* (2023.02); *H10K 59/879* (2023.02)

(58) Field of Classification Search
CPC .. H10K 50/858; H10K 59/879; H10K 59/122; H10K 59/351–353
See application file for complete search history.

(56) References Cited

U.S. PATENT DOCUMENTS

2020/0227489 A1\* 7/2020 Kim ..................... H10K 50/856
2021/0193759 A1    6/2021 Hyun et al.
2021/0351381 A1\* 11/2021 Cai ...................... H10K 59/879

FOREIGN PATENT DOCUMENTS

| CN | 111446379 A | 7/2020 |
|----|-------------|--------|
| CN | 112310305 A | 2/2021 |
| CN | 113013203 A | 6/2021 |

\* cited by examiner

*Primary Examiner* — Eric K Ashbahian
(74) *Attorney, Agent, or Firm* — Anova Law Group, PLLC

(57) ABSTRACT

Display module and display device are provided. The display module includes a display panel, first dimming areas and a second dimming areas. The display panel includes a display array including a plurality of sub-pixels with pixel gaps between adjacent sub-pixels. Both a first dimming area and a second dimming area include at least one of the plurality of sub-pixels. The first dimming area includes a first dimming layer with a refractive index of n1, a second dimming layer with a refractive index of n2. A contact interface between the first dimming layer and the second dimming layer includes a first dimming structure. The second dimming area includes a third dimming layer with a refractive index of n3, and a fourth dimming layer with a refractive index of n4. A contact interface between the third dimming layer and the fourth dimming layer includes a second dimming structure.

19 Claims, 16 Drawing Sheets

DISPLAY MODULE AND DISPLAY DEVICE

CROSS-REFERENCE TO RELATED APPLICATION

This application claims priority of Chinese Patent Application No. 202110742836.9, filed on Jun. 30, 2021, the entire contents of which are hereby incorporated by reference.

FIELD OF THE DISCLOSURE

The present disclosure generally relates to the field of electronic equipment technology and, more particularly, relates to a display module and a display device.

BACKGROUND

With a continuous advancement of science and technology, more and more display devices are widely used, bringing a great convenience, and becoming an indispensable tool for people's work and life today.

A main component of a display device is a display panel. The display panel has a display array which includes a plurality of sub-pixels. An image display is performed through the plurality of sub-pixels. An existing display module has a problem of uneven brightness in different areas.

BRIEF SUMMARY OF THE DISCLOSURE

One aspect of the present disclosure provides a display module. The display module includes a display panel, first dimming areas and second dimming areas. The display panel includes a display array. The display array includes a plurality of sub-pixels with pixel gaps between adjacent sub-pixels. Both a first dimming area of the first dimming areas and a second dimming area of the second dimming areas include at least one of the plurality of sub-pixels. The first dimming area includes a first dimming layer with a refractive index of n1, a second dimming layer with a refractive index of n2. A contact interface between the first dimming layer and the second dimming layer includes a first dimming structure. The second dimming area includes a third dimming layer with a refractive index of n3, and a fourth dimming layer with a refractive index of n4. A contact interface between the third dimming layer and the fourth dimming layer includes a second dimming structure. An angle between the first dimming structure and a plane where the display panel is located is less than 90°. An angle between the second dimming structure and the plane where the display panel is located is less than 90°, and $|n1-n2|<|n3-n4|$.

Another aspect of the present disclosure provides a display device including a display module. The display module includes a display panel, first dimming areas and second dimming areas. The display panel includes a display array. The display array includes a plurality of sub-pixels with pixel gaps between adjacent sub-pixels. Both a first dimming area of the first dimming areas and a second dimming area of the second dimming areas include at least one of the plurality of sub-pixels. The first dimming area includes a first dimming layer with a refractive index of n1, a second dimming layer with a refractive index of n2. A contact interface between the first dimming layer and the second dimming layer includes a first dimming structure. The second dimming area includes a third dimming layer with a refractive index of n3, and a fourth dimming layer with a refractive index of n4. A contact interface between the third dimming layer and the fourth dimming layer includes a second dimming structure. An angle between the first dimming structure and a plane where the display panel is located is less than 90°. An angle between the second dimming structure and the plane where the display panel is located is less than 90°, and $|n1-n2|<|n3-n4|$.

As disclosed, in the display module and the display device provided by the technical solution of the present disclosure, the display module includes first dimming areas and second dimming areas. Both a first dimming area of the first dimming areas and a second dimming area of the second dimming areas include at least one sub-pixel. The first dimming area includes a first dimming layer with a refractive index of n1, a second dimming layer with a refractive index of n2, and a contact interface between the first dimming layer and the second dimming layer includes a first dimming structure. The second dimming area includes a third dimming layer with a refractive index of n3, a fourth dimming layer with a refractive index of n4. A contact interface between the third dimming layer and the fourth dimming layer includes a second dimming structure. $|n1-n2|<|n3-n4|$. An angle between the first dimming structure and a plane where the display panel is located, and the angle between the second dimming structure and the plane where the display panel is located are both less than 90°. Therefore, by adjusting a refractive index difference of the two dimming layers in the first dimming area, a refractive index difference of the two dimming layers in the second dimming area, and angles between the two dimming structures and the plane where the display panel is located, light emission directions of the first dimming area and the second dimming area can be adjusted, so that a light brightness from different areas of the display module is uniform, and a display effect is improved.

BRIEF DESCRIPTION OF THE DRAWINGS

To explain embodiments of the present disclosure or technical solutions in the art more clearly, the following will briefly introduce accompanying drawings that need to be used in the description of the embodiments or the art. The accompanying drawings in the following description are merely the embodiments of the present disclosure. For those skilled in the art, without creative efforts, other drawings can be obtained based on the provided accompanying drawings.

The structure, ratio, size, etc. shown in the accompanying drawings of the present specification are only used to match the content disclosed in the present specification for those skilled in art to read and understand and are not used to limit implementation conditions of the present disclosure and have no technical significance. Any structural modification, proportional relationship change, or size adjustment shall still fall within the scope of the technical content disclosed in the present disclosure without affecting the effects and objectives that can be achieved by present disclosure.

DETAILED DESCRIPTION

The following will clearly and completely describe embodiments of the present disclosure with reference to the accompanying drawings in the embodiments of the present disclosure. The described embodiments are only part of the embodiments of the present disclosure, rather than all the embodiments. Based on the embodiments of the present disclosure, all other embodiments obtained by those skilled in the art without creative efforts shall fall within the protection scope of the present disclosure.

To make the above objectives, features, and advantages of the present disclosure clearer and more understandable, the present disclosure will be further described in detail below with reference to the accompanying drawings and specific implementations.

Figure 1:
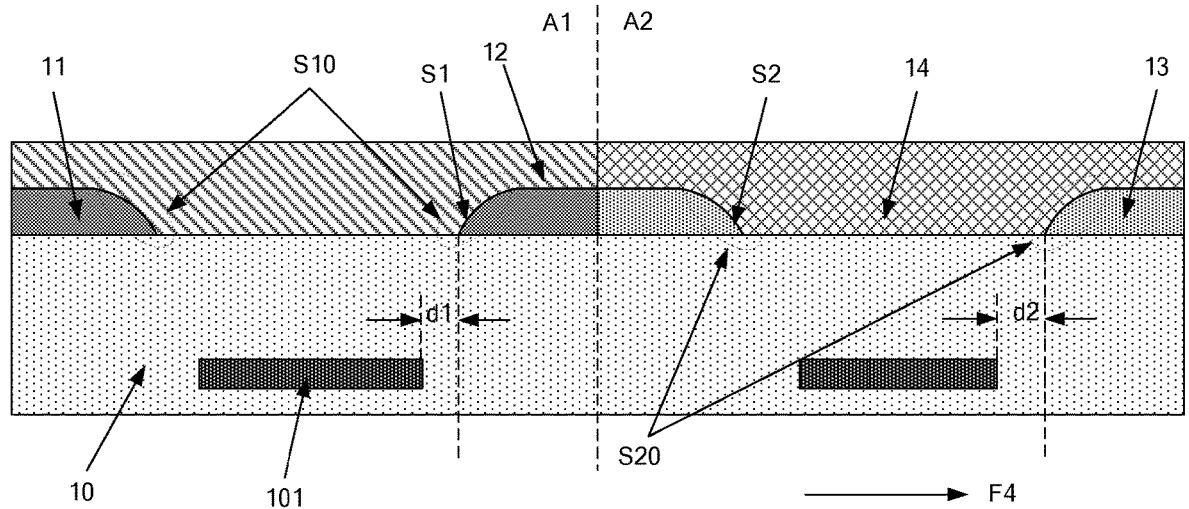
FIG. 1 illustrates a cross-sectional view of a display module consistent with various embodiments of the present disclosure.

FIG. 1 illustrates a cross-sectional view of a display module consistent with various embodiments of the present disclosure. The display module includes a display panel 10, first dimming areas A1 and second dimming areas A2. The display panel 10 includes a display array. The display array includes a plurality of sub-pixels 101 with pixel gaps between adjacent sub-pixels. Both a first dimming area A1 and a second dimming area A2 include at least one of the sub-pixels 101. The first dimming area A1 includes a first dimming layer 11 with a refractive index of n1, a second dimming layer 12 with a refractive index of n2. A contact interface S1 between the first dimming layer 11 and the second dimming layer 12 includes a first dimming structure S10. The second dimming area A2 includes a third dimming layer 13 with a refractive index of n3, and a fourth dimming layer 14 with a refractive index of n4. A contact interface S2 between the third dimming layer 13 and the fourth dimming layer 14 includes a second dimming structure S20. An angle between the first dimming structure S10 and a plane where the display panel 10 is located is less than 90°. An angle between the second dimming structure S20 and the plane where the display panel 10 is located is less than 90°, and |n1−n2|<|n3−n4|.

In one embodiment, by adjusting a refractive index difference of the two dimming layers in the first dimming area A1, a refractive index difference of the two dimming layers in the second dimming area A2, and angles between the two dimming structures and the plane where the display panel 10 is located, a light direction of the first dimming area and the second dimming area can be adjusted, so that a light brightness from different areas of the display module is uniform, and a display effect is improved.

It should be noted that for a rigid and inflexible display module, the plane where the display panel 10 is located is a light emission side surface of the display panel 10. For a bendable display module, the plane where the display panel 10 is the light emission side surface of the display panel 10 when the display panel is in a flat state. The angle between the first dimming structure S10 and the plane where the display panel 10 is located refers to an included angle formed by a tangent of a contact interface S1 and the plane that is greater than 0° and less than 90°. The angle between the second dimming structure S20 and the plane where the display panel 10 is located refers to an included angle formed by a tangent of a contact interface S1 and the plane that is greater than 0° and less than 90°. That is, the first dimming structure S10 and the second dimming structure S20 are arranged obliquely with respect to the plane where the display panel 10 is located.

Figure 2:
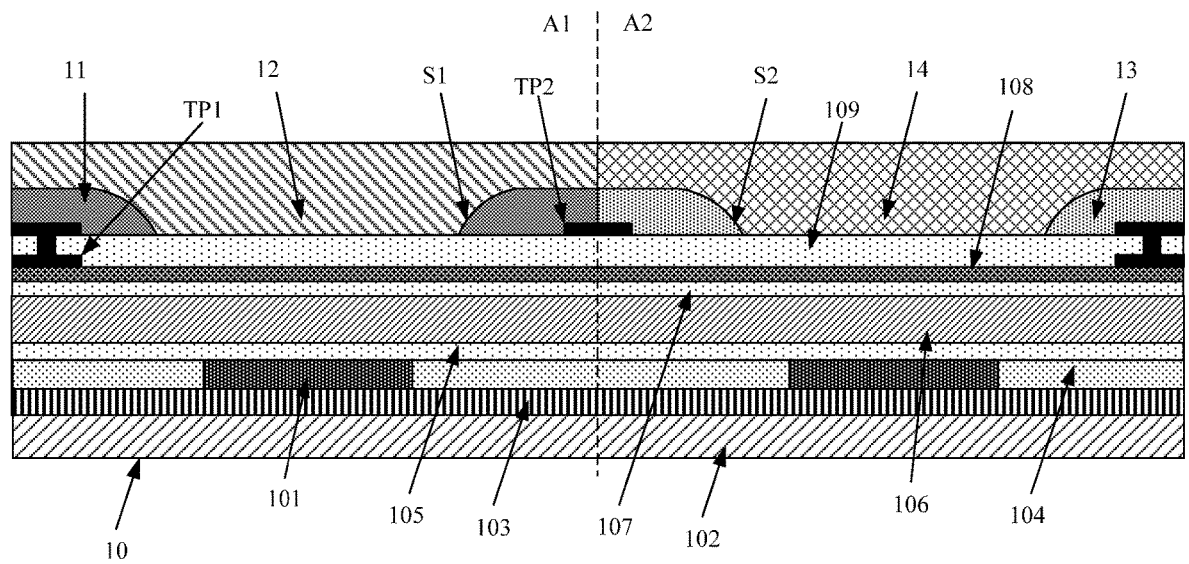
FIG. 2 illustrates a cross-sectional view of another display module consistent with various embodiments of the present disclosure.

FIG. 2 illustrates a cross-sectional view of another display module consistent with various embodiments of the present disclosure. In some embodiments, the display panel 10 shown in FIG. 1 may be an OLED panel, as shown in FIG. 2. The OLED panel has an array substrate 102. There is a buffer layer 103 between the array substrate and the display array. The buffer layer 103 has a pixel definition layer 104 on a side away from the array substrate 102. The pixel definition layer 104 has a plurality of pixel openings corresponding to the sub-pixels 101 one-to-one. Each pixel opening is provided with a sub-pixel 101. There is a plastic encapsulation structure on a side of the sub-pixel 101 and the pixel definition layer 104 away from the array substrate 102. The plastic encapsulation structure may include a first inorganic plastic encapsulation layer 105, an organic plastic encapsulation layer 106, and a second inorganic plastic encapsulation layer 107 sequentially arranged. Various dimming layers are provided on a side of the plastic-encapsulated structure back to the sub-pixel 101.

It is also possible to provide a touch structure on a side of the plastic encapsulation structure away from the sub-pixel 101. The touch structure includes a first touch electrode layer TP1 and a second touch electrode layer TP2. For example, a first insulating protection layer 108 may be provided on a side of the plastic encapsulation structure away from the sub-pixel 101. The patterned first touch electrode layer TP1 may be provided on a side of the first insulating protection layer 108 away from the plastic packaging structure. A second insulating protection layer 109 may be provided on a side of the first touch electrode layer TP1 away from the first insulating protection layer 108. The patterned second touch electrode layer TP2 may be provided on a side of the second insulating protection layer 109 away from the first touch electrode layer TP1. In a direction perpendicular to the plane where the display panel 10 is located, there is no overlap between the touch electrode structure and the sub-pixel 101. Various dimming layers are provided on a side of the second insulating protection layer 109 and the second touch electrode layer TP2 away from the display sub-pixel 101.

In the embodiments of the present disclosure, the display panel 10 is not limited to an OLED panel, and can also be other types of display panels, such as a Mini LED panels or a Micro LED panel, etc.

In one embodiment, both the first dimming layer 11 and the third dimming layer 13 are in a first layer. The first layer includes hollowed areas and non-hollowed areas. Both the second dimming layer 12 and the fourth dimming layer 14 are located on a second layer. The second layer fills the hollowed area and covers a surface of the first layer facing away from the display panel 10. For example, the second dimming layer 12 fills the hollowed areas in the first dimming layer 11 and covers a surface of the non-hollowed areas of the first dimming layer 11 facing away from the display panel 10. A position of a side wall of the non-hollowed area in the first dimming layer 11 is the first dimming structure S10. The fourth dimming layer 14 fills the hollowed areas in the third dimming layer 13 and covers a surface of the non-hollowed areas of the third dimming layer 13 facing away from the display panel 10. A position of a side wall of the non-hollowed areas in the third dimming layer 13 is the second dimming structure S20.

Through the patterned first dimming layer 11 and the patterned third dimming layer 13, a structure and layout of the hollowed areas and the non-hollowed areas can be set to realize the required first dimming structure S10 and second dimming Structure S20, adjust a light emission direction of the display module to improve a uniformity of a light output of the display module and improve a display quality.

It can be set that the first layer has a plurality of hollowed areas. A vertical projection of a hollowed area of the plurality of hollowed areas on the display panel 10 covers at least one sub-pixel 101. A contact interface between a non-hollowed area and each hollowed area is a first dimming structure S10 or a second dimming structure S20 and can adjust a light emission direction of the sub-pixel 101 covered by the vertical projection of the hollowed area of the plurality of hollowed areas. A refractive index n1 of the first dimming layer 11 is smaller than a refractive index n2 of the second dimming layer 12. A refractive index n3 of the third dimming layer 13 is smaller than a refractive index n4 of the fourth dimming layer 14. Therefore, a light emission direction of the sub-pixel 101 is covered by the second dimming layer 12 with a larger refractive index. A pixel gap is filled with the first dimming layer 11 with a lower refractive index, which is equivalent to forming a micro lens structure on a light emission side of the sub-pixel 101 to adjust a light emission direction of the sub-pixel 101. Or, a light emission direction of the sub-pixel 101 is covered by the fourth dimming layer 14 with a larger refractive index. A pixel gap is filled with the third dimming layer 13 with a lower refractive index, which is also equivalent to forming a micro lens structure on the light emission side of the sub-pixel 101 to adjust the light emission direction of the sub-pixel 101.

A vertical projection of the first dimming structure S10 on the display panel 10 surrounds at least one sub-pixel 101. Therefore, the first dimming structure S10 serves as a micro lens of the sub-pixel 101 surrounded by the vertical projection of the first dimming structure S10 and can adjust a light emission direction of the sub-pixel 101 surrounded by the vertical projection of the first dimming structure S10. A vertical projection of the second dimming structure S20 on the display panel 10 surrounds at least one sub-pixel 101. The second dimming structure S20 is used as a micro lens of the sub-pixel 101 surrounded by the vertical projection of the first dimming structure S10 and can adjust the light emission direction of the sub-pixel 101 surrounded by the vertical projection of the first dimming structure S10.

In one embodiment, when there is a plurality of hollowed areas, each hollowed area corresponds to a first dimming structure S10 or a second dimming structure S20. The hollowed area in the first layer can be set to correspond to the sub-pixel 101 one-to-one. A vertical projection of a hollowed area of the plurality of hollowed areas on the display panel 10 can be set to cover the corresponding sub-pixel 101. Therefore, each sub-pixel 101 is correspondingly provided with a dimming structure, which can be used as a micro lens of the sub-pixel 101 to adjust a light emission direction.

As shown in FIGS. 1 and 2, when the vertical projection of the hollowed area of the plurality of hollowed areas on the display panel 10 covers at least one sub-pixel 101, when $n1<n2$, and $n3<n4$, $n2=n4$ can be set. Therefore, the second dimming layer 12 and the fourth dimming layer 14 can be made of a same high refractive index material at a same time, so that the entire display module is made of a same layer of high refractive index material to make all the second dimming layer 12 and the fourth dimming layer 14, simplifying a forming process.

Alternatively, when the vertical projection of the hollowed area of the plurality of hollowed areas on the display panel 10 covers at least one sub-pixel 101, and n1<n2, and n3<n4, n1=n3 can be set. Therefore, the first dimming layer 11 and the third dimming layer 14 can be made of a same high refractive index material at a same time, so that the entire display module is made of a same layer of high refractive index material to make all the second dimming layer 12 and the fourth dimming layer 14, simplifying a forming process.

Figure 3:
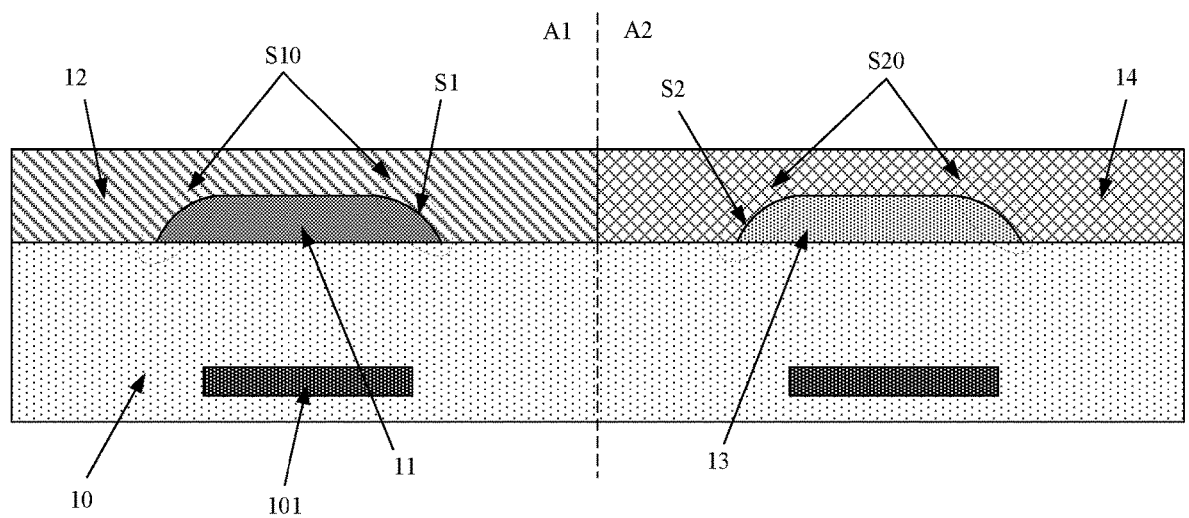
FIG. 3 illustrates a schematic diagram of another display module consistent with various embodiments of the present disclosure.

FIG. 3 illustrates a schematic diagram of a display array consistent with various embodiments of the present disclosure. The first layer has a plurality of hollowed areas. A vertical projection of a hollowed area of the plurality of hollowed areas on the display panel 10 covers at least one sub-pixel. A side wall of each non-hollowed area is the first dimming structure S10 or the second dimming structure S20 to adjust the light emission direction of the sub-pixel 101 covered by a vertical projection of the first dimming structure S10 or the second dimming structure S20. For example, the second dimming layer 12 fills the hollowed areas in the first dimming layer 11 and covers the non-hollowed areas of the first dimming layer 11 facing away from the display panel 10. A position of a side wall of the non-hollowed area in the first dimming layer 11 is the first dimming structure S10. The fourth dimming layer 14 fills the hollowed areas in the third dimming layer 13 and covers a surface of the non-hollowed areas of the third dimming layer 13 facing away from the display panel 10. A position of a side wall of the non-hollowed areas in the third dimming layer 13 is the second dimming structure S20.

As shown in FIG. 3 can also use the patterned first dimming layer 11 and the patterned third dimming layer 13 to set a structure and layout of the hollowed areas and the non-hollowed areas to realize the required first dimming structure S10 and the second dimming structure S20, which adjust the light emission direction of the display module to improve a uniformity of a light output of the display module and improve a display quality.

When a vertical projection of the non-hollowed areas on the display panel 10 covers at least one sub-pixel, as shown in FIG. 3, the refractive index n1 of the first dimming layer 11 can be set to be smaller than the refractive index n2 of the second dimming layer 12. The refractive index n3 of the third dimming layer 13 is smaller than the refractive index n4 of the fourth dimming layer 14.

In other embodiments, when the vertical projection of the non-hollowed areas on the display panel 10 covers at least one sub-pixel, as shown in FIG. 3, the refractive index n1 of the first dimming layer 11 can be set to be greater than the refractive index n2 of the second dimming layer 12, and the refractive index n3 of the third dimming layer 13 can be set to be greater than greater than the refractive index n4 of the fourth dimming layer 14.

Figure 4:
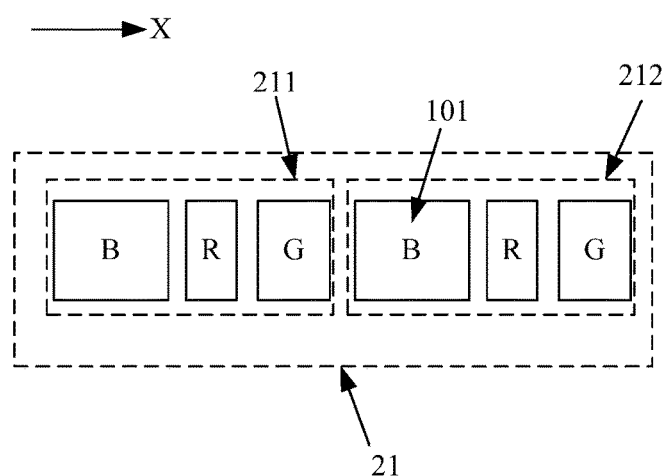
FIG. 4 illustrates a schematic diagram of a display array consistent with various embodiments of the present disclosure.

FIG. 4 illustrates a schematic diagram of another display array consistent with various embodiments of the present disclosure. The display array includes a sub-display array 21. With reference to a cross-sectional view of the display module of the above embodiment, as shown in FIG. 4, the sub-display array 21 includes a plurality of first sub-pixel groups 211 and a plurality of second sub-pixel groups 212 alternately arranged in a first direction X. Both a first sub-pixel group of the plurality of first sub-pixel groups 211 and a second sub-pixel group of the plurality of second sub-pixel groups 212 include at least one sub-pixel 101. The first direction X is parallel to the plane where the display panel 10 is located. In the direction perpendicular to the plane where the display panel 10 is located, each first sub-pixel group 211 corresponds to a first dimming area A1. Each second sub-pixel group 212 corresponds to a second dimming area A2.

In the direction perpendicular to the plane where the display panel 10 is located, the first sub-pixel group 211 is in the corresponding first dimming area A1. The second sub-pixel group 212 is in the corresponding second dimming area A2. In the direction perpendicular to the plane where the display panel 10 is located, the first dimming structure S10 in the first dimming area A1 surrounds the corresponding first sub-pixel group 211, that is, the first dimming structure S10 and the sub-pixel 101 do not overlap. The second dimming structure S20 in the second dimming area A2 surrounds the corresponding second sub-pixel group 212, that is, the second dimming structure S20 does not overlap the sub-pixel 101.

As shown in FIG. 4, in the same sub-display array 21, in the first direction X, the sub-pixels 101 in the first sub-pixel group 211 can adjust a light emission direction through the correspondingly provided first dimming area A1. The sub-pixel 101 in the second sub-pixel group 212 can adjust a light emission direction through the correspondingly set second dimming area A2. In the same sub-display array 21, the regionalized light emission adjustment is realized, so that a light output in the sub-display array 21 is uniform.

For illustration purposes, although only one first sub-pixel group 211 and one second sub-pixel group 212 are illustrated in FIG. 4, any number of the first sub-pixel groups and any number of first sub-pixel groups are encompassed within the present disclosure. Each of the first sub-pixel groups 211 and each of the second sub-pixel groups 212 includes three sub-pixels 101. In the first direction X, in a same sub-display array 21, number of first sub-pixel groups 211 and number of second sub-pixel groups 212 can be set according to requirements. Number of sub-pixels 101 in the first sub-pixel group 211 and number of sub-pixels 101 in the second sub-pixel group 212 can be set according to requirements. The number of sub-pixels 101 in the first sub-pixel group 211 and the number of sub-pixels 101 in the second sub-pixel group 212 may be same or different.

Figure 5:
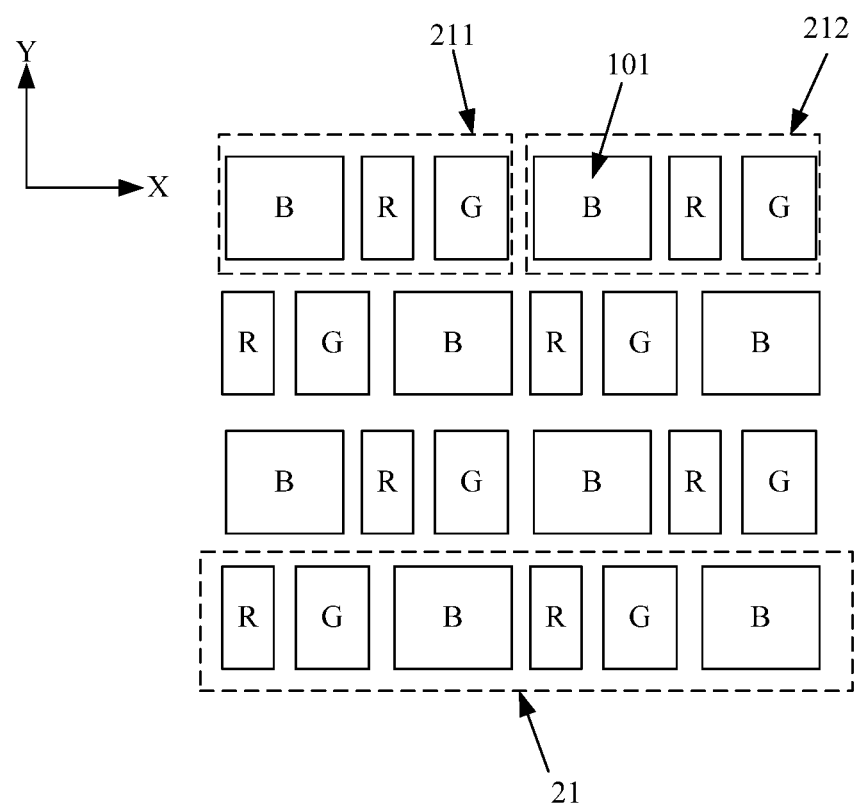
FIG. 5 illustrates a schematic diagram of another display array consistent with various embodiments of the present disclosure.

FIG. 5 illustrates a schematic diagram of another display array consistent with various embodiments of the present disclosure. The display array includes the sub-display array 21. With reference to a cross-sectional view of the display module of the above embodiment, as shown in FIG. 5, the display array includes a plurality of sub-display arrays 21 sequentially arranged in a second direction Y. The second direction Y is perpendicular to the first direction X and parallel to the plane where the display panel 10 is located.

As shown in FIG. 5, setting the display array including a plurality of sub-display arrays 21 arranged in sequence in the second direction Y can not only adjust a light emission direction of areas in the first direction X, but also adjust a light emission direction of areas in the second direction Y.

In one embodiment, when a pixel unit array in the display array is arranged, the first direction X can be set as a row direction of the array, and the second direction Y can be set as a column direction of the array. The pixel unit includes a plurality of sub-pixels with different colors.

In one embodiment, both the first sub-pixel group 211 and the second sub-pixel group 212 can be set to include at least one pixel unit. In the first sub-pixel group 211 and the second sub-pixel group 212, number of sub-pixels 101 and arrangement of the sub-pixels 101 are same.

When both the first sub-pixel group 211 and the second sub-pixel group 212 include at least one pixel unit, number of pixel units in the first sub-pixel group 211 and the second sub-pixel group 212 can be set to be same or different. Both the first sub-pixel group 211 and the second sub-pixel group can be set to include at least one pixel unit, which facilitates a division of the sub-pixel groups and a layout and forming of dimming structures corresponding to the sub-pixel groups.

A pixel unit can be set to includes three sub-pixels 101 sequentially arranged in the first direction X. Light emission colors of the three sub-pixels 101 are a red sub-pixel R, a green sub-pixel G, and a blue sub-pixel B, respectively. As shown in FIGS. 4 and 5, number of pixel units in the first sub-pixel group 211 and the second sub-pixel group 212 are same. Both the first sub-pixel group 211 and the second sub-pixel group 212 have one pixel unit. Therefore, a pixel unit is used as an independent dimming area, and an adjustment of a local light emission direction is realized on a scale of a single pixel unit.

Figure 6:
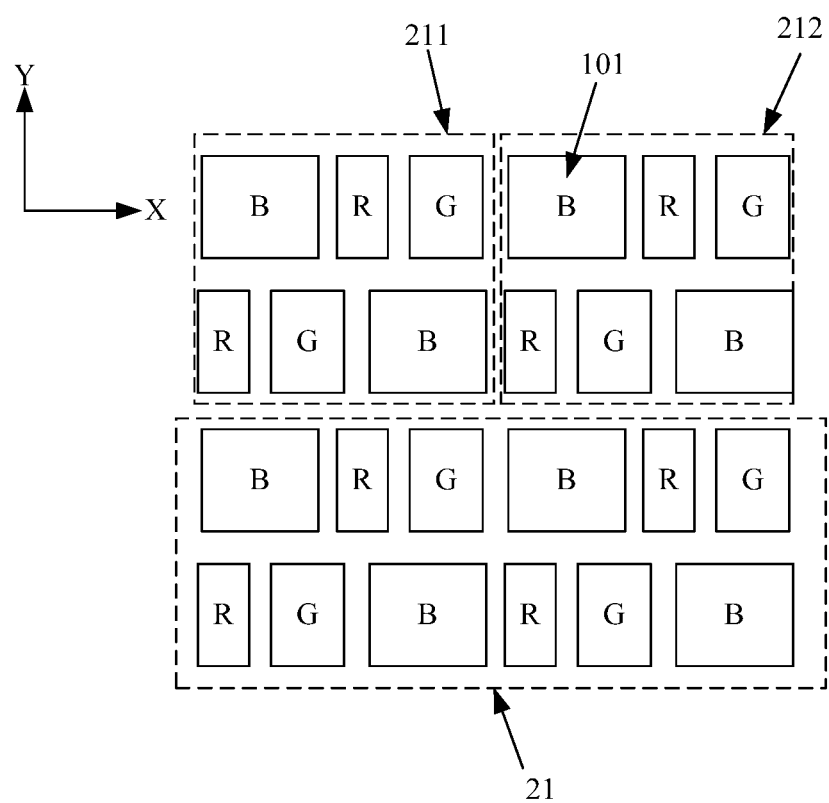
FIG. 6 illustrates a schematic diagram of another display array consistent with various embodiments of the present disclosure.

FIG. 6 illustrates a schematic diagram of another display array consistent with various embodiments of the present disclosure. As shown in FIG. 6, the first sub-pixel group 211 and the second sub-pixel group 212 both include two-pixel units. The two-pixel units in a same sub-pixel group are sequentially arranged in the second direction Y. Therefore, two adjacent pixel units in the second direction Y are used as an independent dimming area, and an adjustment of a local light emission direction is realized on a scale of the adjacent two-pixel units.

In other embodiments, when the first sub-pixel group 211 includes a plurality of pixel units, the plurality of pixel units can be sequentially arranged in the first direction X or sequentially arranged in the second direction Y. When the second sub-pixel group 212 includes a plurality of pixel units, the plurality of pixel units can be sequentially arranged in the first direction X or sequentially arranged in the second direction Y.

When both the first sub-pixel group 211 and the second sub-pixel group 212 include at least one pixel unit, number of pixel units in the two sub-pixel groups can be same or different.

Figure 7:
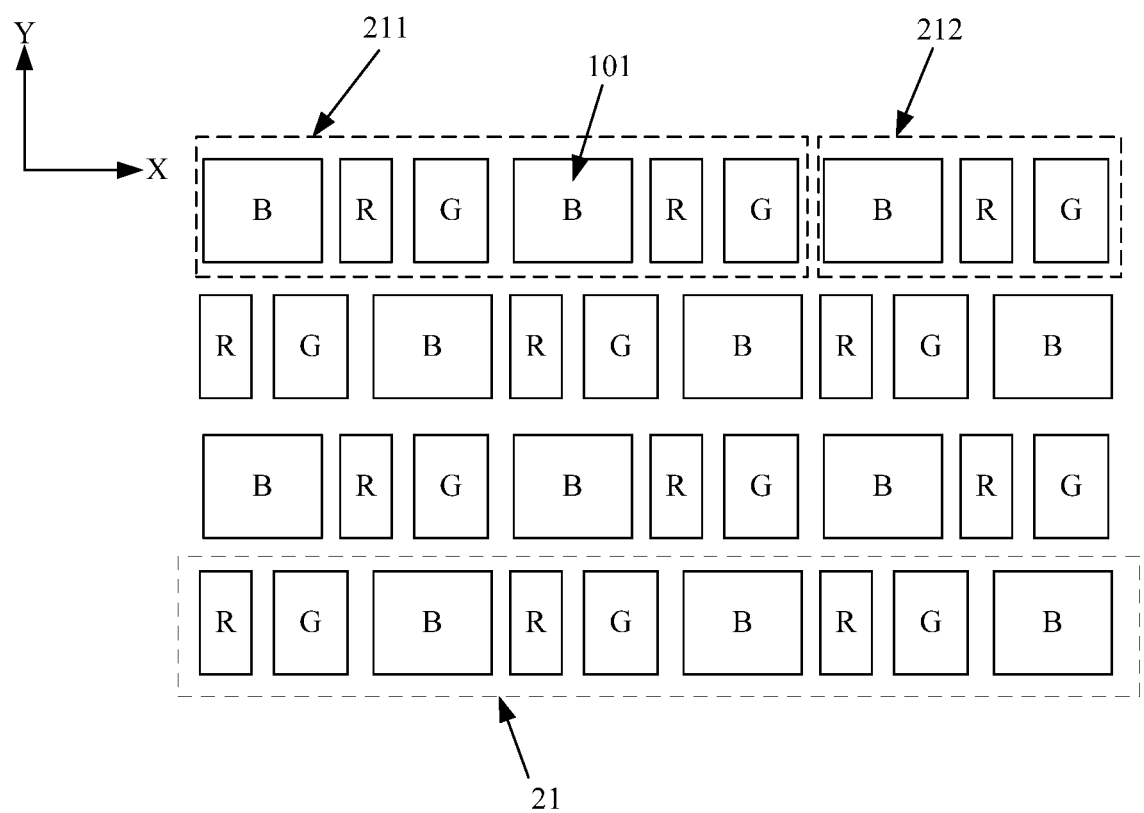
FIG. 7 illustrates a schematic diagram of another display array consistent with various embodiments of the present disclosure.

FIG. 7 illustrates a schematic diagram of another display array consistent with various embodiments of the present disclosure. As shown in FIG. 7, both the first sub-pixel group 211 and the second sub-pixel group 212 include a plurality of sub-pixel units and have different numbers of pixel units. For example, the first sub-pixel group 211 has two adjacent pixel units in the first direction X, and the second sub-pixel group 212 has one pixel unit. One or more-pixel units are used as an independent dimming area, and an adjustment of a local light emission direction is realized on a scale of one or more pixel units.

Figure 8:
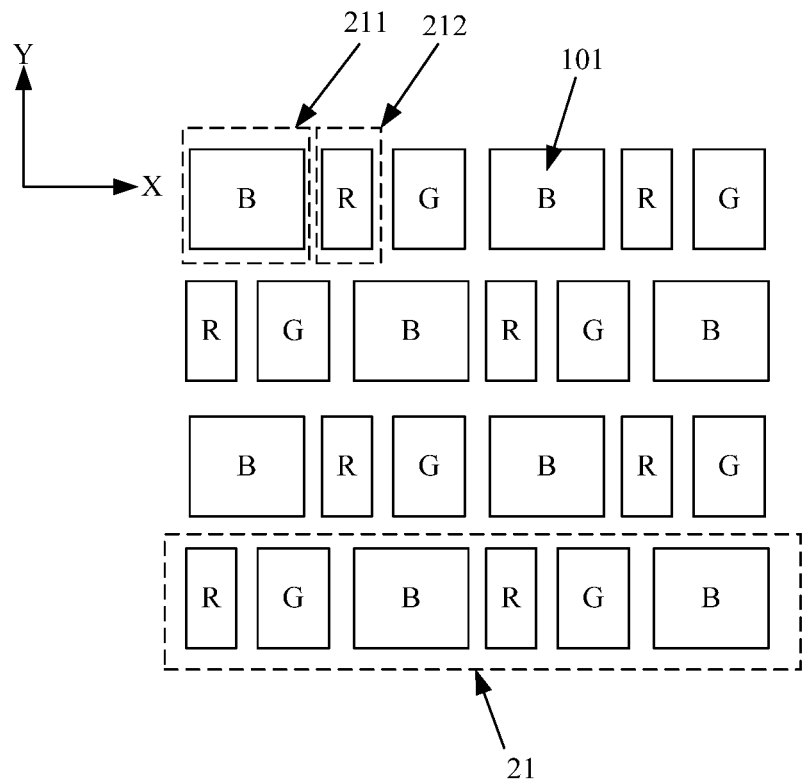
FIG. 8 illustrates a schematic diagram of another display array consistent with various embodiments of the present disclosure.

FIG. 8 illustrates a schematic diagram of another display array consistent with various embodiments of the present disclosure. As shown in FIG. 8, both the first sub-pixel group 211 and the second sub-pixel group 212 include one sub-pixel 101. Each sub-pixel 101 is used as an independent dimming area, and an adjustment of a local light emission direction is realized on a scale of a single sub-pixel 101.

Figure 9:
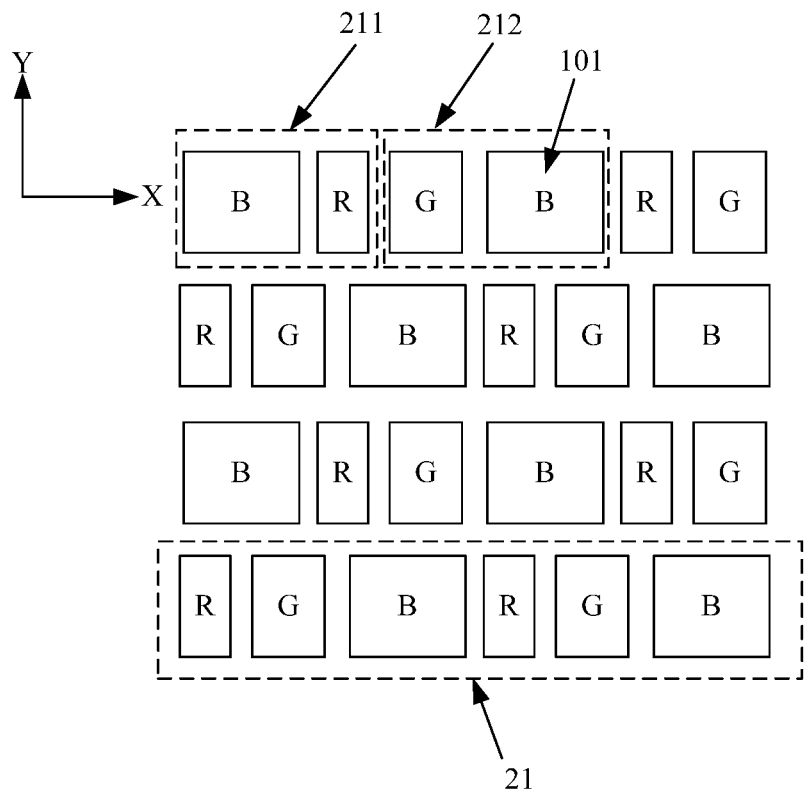
FIG. 9 illustrates a schematic diagram of another display array consistent with various embodiments of the present disclosure.

FIG. 9 illustrates a schematic diagram of another display array consistent with various embodiments of the present disclosure. As shown in FIG. 9, both the first sub-pixel group 211 and the second sub-pixel group 212 include two sub-pixels 101. Two adjacent sub-pixels 101 in the first direction are used as an independent dimming area, and an adjustment of a local light emission direction is realized on a scale of two adjacent sub-pixels 101.

As shown in FIGS. 4-9, the pixel unit includes a red sub-pixel R, a green sub-pixel G, and a blue sub-pixel B arranged in the first direction X. In a display array, a plurality of pixel unit arrays is arranged.

In other embodiments of the present disclosure, an arrangement of windmills as shown in FIGS. 10-14 can also be used to set that he pixel unit includes two adjacent sub-pixels 101 in the first direction X. The two sub-pixels 101 have different light emission colors. Light emission colors of sub-pixels in two adjacent pixel units in the second direction Y are not completely same. Therefore, two adjacent pixel units in the second direction Y are set as a first pixel unit and a second pixel unit, respectively. The first pixel unit has a first color sub-pixel and a second color sub-pixel. The second pixel unit has a second color sub-pixel and a third color sub-pixel. By means of pixel rendering, the first pixel unit multiplexes the third color sub-image in the second pixel unit for light emission display, and the second pixel unit multiplexes the first color sub-pixel in the first pixel unit for light emission display. The first color sub pixel, the second color sub pixel, and the third color sub pixel are in one-to-one correspondence with the red sub pixel R, the green sub pixel G and the blue sub pixel B, thereby realizing an RGB three primary colors display.

Figure 10:
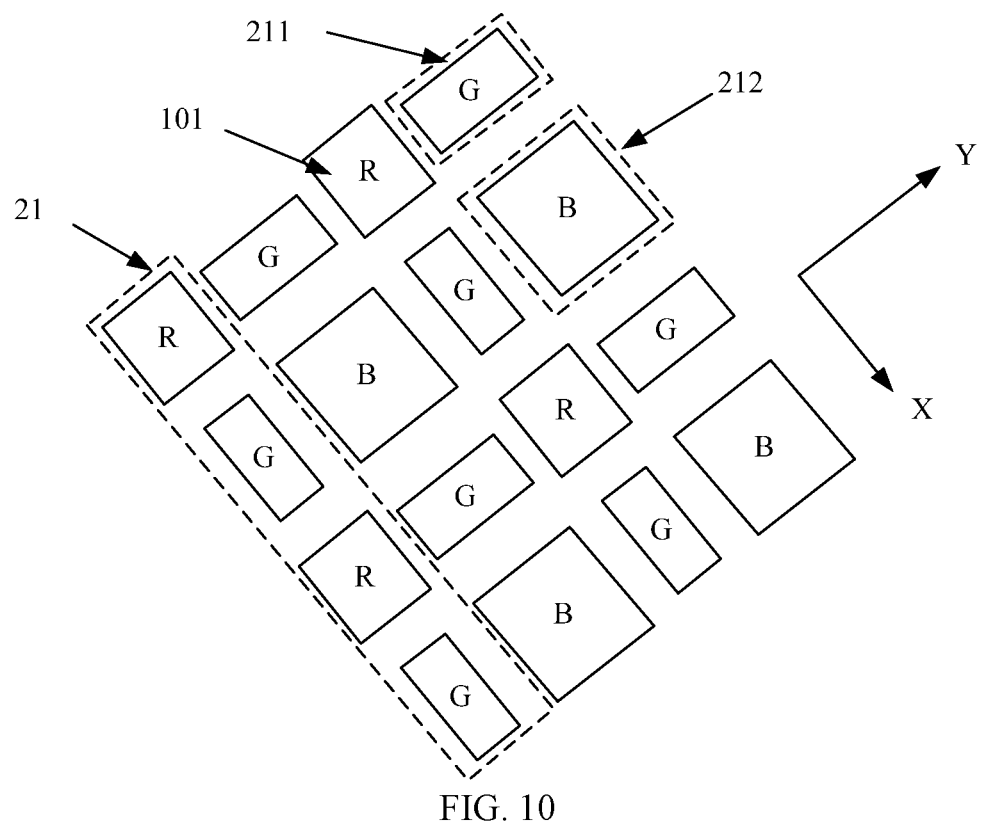
FIG. 10 illustrates a schematic diagram of another display array consistent with various embodiments of the present disclosure.

FIG. 10 illustrates a schematic diagram of another display array consistent with various embodiments of the present disclosure. In one embodiment, the embodiment shown in FIG. 10 is same or similar as the embodiment shown in FIG. 7. Both the first sub-pixel group 211 and the second sub-pixel group 212 include a sub-pixel 101. Each sub-pixel 101 is used as an independent dimming area, and an adjustment of a local light emission direction is realized on a scale of a single sub-pixel 101.

Figure 11:
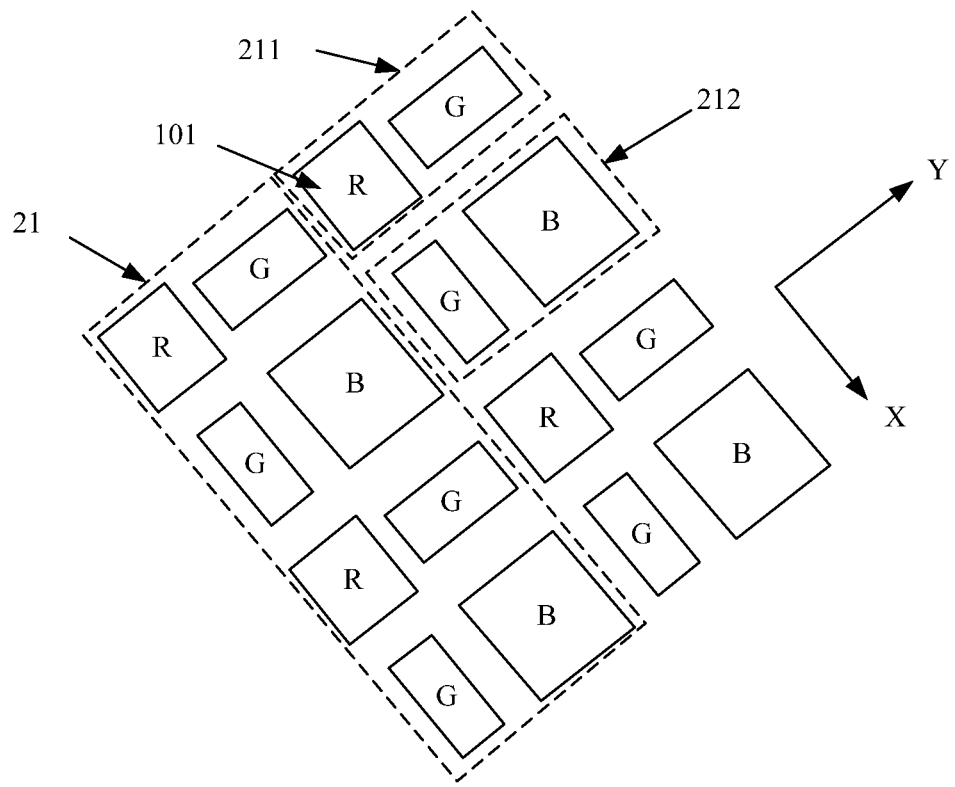
FIG. 11 illustrates a schematic diagram of another display array consistent with various embodiments of the present disclosure.

FIG. 11 illustrates a schematic diagram of another display array consistent with various embodiments of the present disclosure. As shown in FIG. 11, Both the first sub-pixel group 211 and the second sub-pixel group 212 include two sub-pixels 101 adjacent to each other in the second direction Y. The two adjacent sub-pixels 101 in the second direction Y are used as an independent dimming area, and an adjustment of a local light emission direction is realized on a scale of the two adjacent sub-pixels 101.

Figure 12:
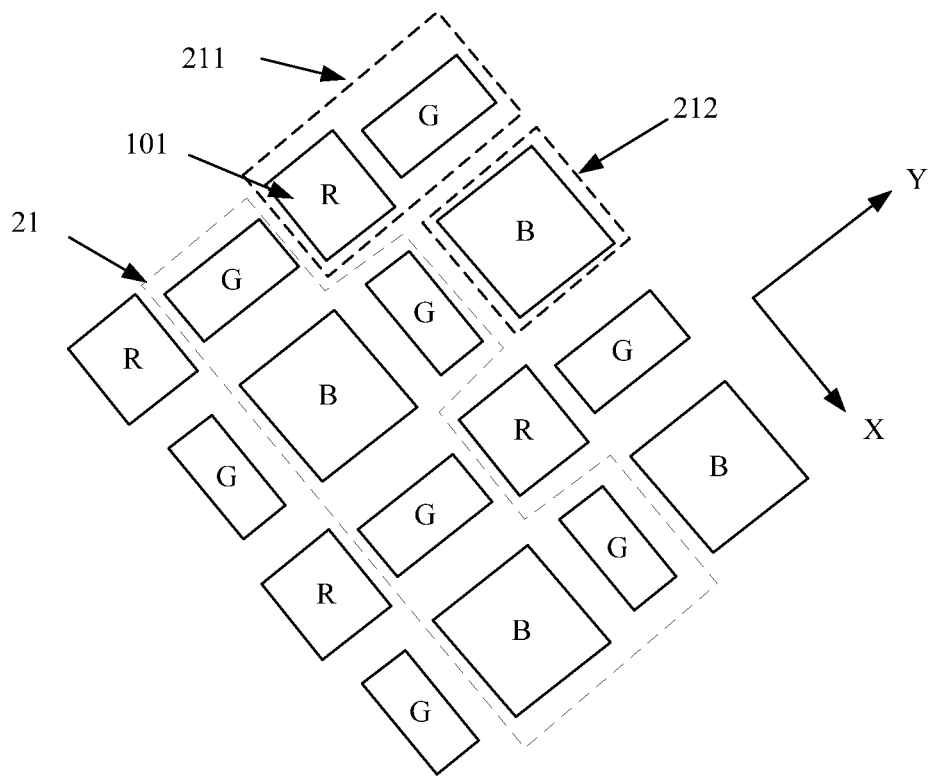
FIG. 12 illustrates a schematic diagram of another display array consistent with various embodiments of the present disclosure.

FIG. 12 illustrates a schematic diagram of another display array consistent with various embodiments of the present disclosure. As shown in FIG. 12, The first sub-pixel group 211 includes two sub-pixels 101 adjacent to each other in the second direction Y. The second sub-pixel group 212 includes one sub-pixel 101. As shown in FIG. 12, in the second direction Y, the first sub-pixel groups 211 and the second sub-pixel groups 212 of different sub-display arrays 21 are set to be alternately arranged, so that two adjacent sub-display arrays in the second direction Y include three consecutive rows of sub-pixels 101, which facilitates a layout of dimming structures. One or more sub-pixels 101 are used as an independent dimming area, and an adjustment of a local light emission direction is realized on a scale of one or more-pixel units.

Figure 13:
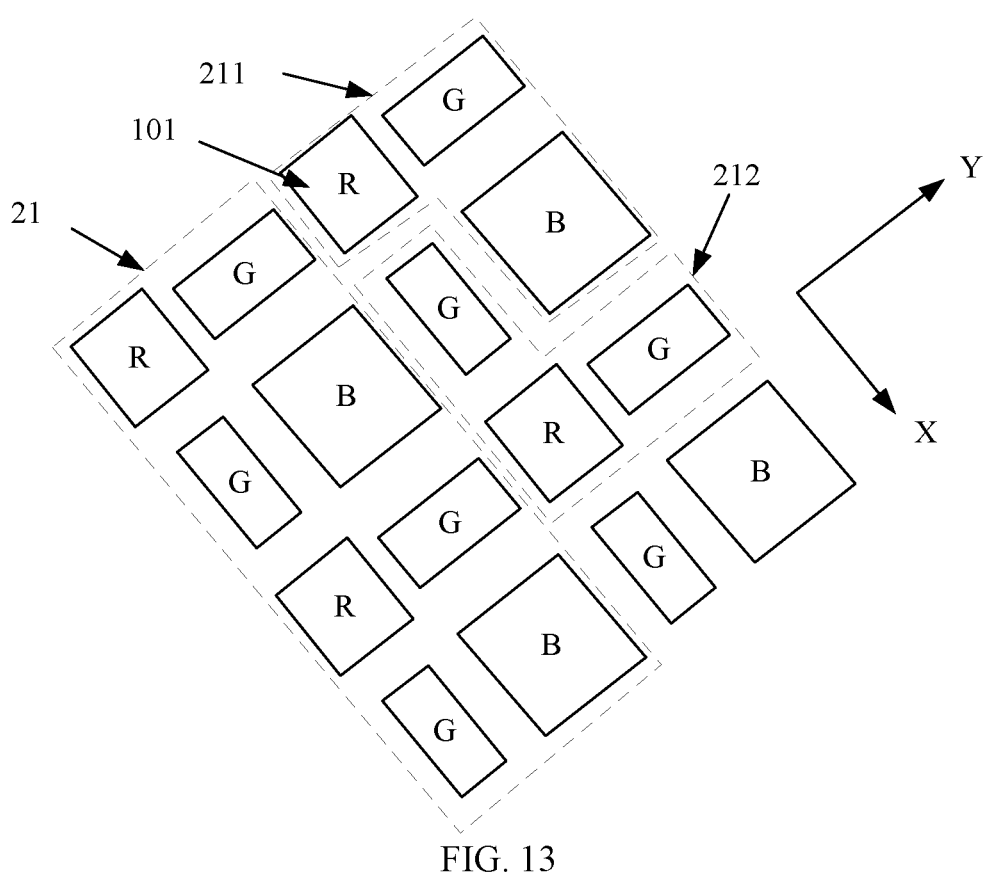
FIG. 13 illustrates a schematic diagram of another display array consistent with various embodiments of the present disclosure.

FIG. 13 illustrates a schematic diagram of another display array consistent with various embodiments of the present disclosure. As shown in FIG. 13, both the first sub-pixel group 211 and the second sub-pixel group 212 include three sub-pixels 101. In the first sub-pixel group 211 and the second sub-pixel group 212 adjacent in the first direction X, 6 sub-pixels 101 are arranged in 2 rows and 3 columns. Three sub-pixels 101 in the first sub-pixel group 211 and one sub-pixel in the second sub-pixel group 212 are arranged in 2 rows and 2 columns. Three sub-pixels 101 in the second sub-pixel group 212 and one sub-pixel in the first sub-pixel group 211 are arranged in 2 rows and 2 columns. Three-pixel units are used as an independent dimming area, and an adjustment of a local light emission direction is realized on a scale of one or more sub-pixels 101.

Figure 14:
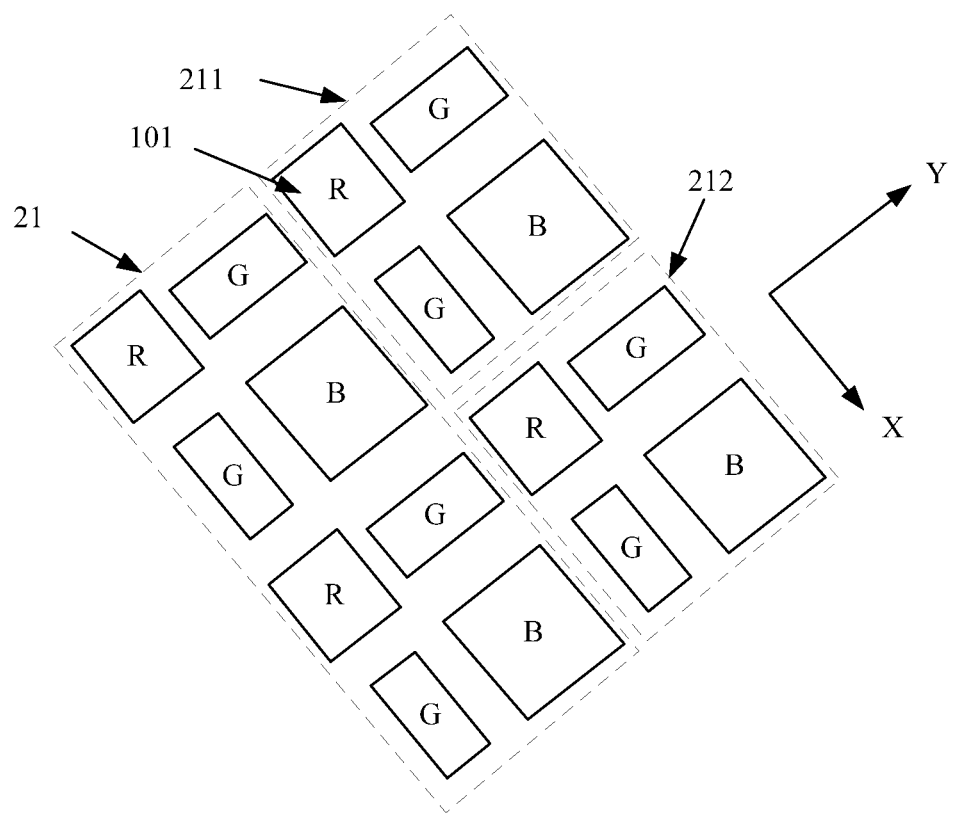
FIG. 14 illustrates a schematic diagram of another display array consistent with various embodiments of the present disclosure.

FIG. 14 illustrates a schematic diagram of another display array consistent with various embodiments of the present disclosure. In one embodiment, the embodiment shown in FIG. 14 is same or similar as the embodiment shown in FIG. 6, the first sub-pixel group 211 and the second sub-pixel group 212 both include two-pixel units. The two-pixel units in a same sub-pixel group are sequentially arranged in the second direction Y. Two adjacent pixel units in the second direction Y is used as an independent dimming area, and an adjustment of a local light emission direction is realized on a scale of two adjacent pixel units.

In one embodiment, In the first sub-pixel group 211 and the second sub-pixel group 212, at least one of number of the sub-pixels 101 and arrangement of the sub-pixels is different. The number of sub-pixels 101 and the arrangement of the sub-pixels in the first sub-pixel group 211 and the second sub-pixel group 212 can also be set to be same. The number of sub-pixels 101 in the first sub-pixel group 211 and the second sub-pixel group 212 and the arrangement of the sub-pixels can be set according to requirements, which are not limited herein. Both the first sub-pixel group 211 and the second sub-pixel group 212 are independent dimming areas, and an adjustment of a local light emission direction of the display module is realized.

In the first direction X, in a same sub-display array, the first sub-pixel group 211 and the second sub-pixel group 212 are alternately arranged, so that the first dimming area A1 and the second dimming area A2 are alternately arranged. In the second direction Y, according to requirements, the first sub-pixel group 211 and the first sub-pixel group 211 are set to be adjacent to each other, the second sub-pixel group 212 and the second sub-pixel group 212 are set to be adjacent to each other, or the first sub-pixel group 211 and the second sub-pixel group 212 are set to be adjacent to each other in the two adjacent sub-display arrays 21.

According to the description of the embodiments shown in FIG. 4 to FIG. 14, in one embodiment, the corresponding first dimming area A1 and the corresponding second dimming area A2 can be set based on the divided first sub-pixel group 211 and second sub-pixel group 212 to realize an adjustment of a local light emission direction, so that a light output of the display module has a good uniformity, and a display effect is improved. Number and arrangement of the sub-pixels 101 in the first sub-pixel group 211 and the second sub-pixel group 212 can be set based on requirements, which is not limited herein.

In FIGS. 4 to 14, the sub-pixels 101 of a same color have a same size. In view of the different light emission efficiency of the sub-pixels of three color, the red sub-pixel R, the green sub-pixel G, and the blue sub-pixel B are set to have different sizes. For example, a size of the blue sub-pixel B is the largest, a size of the red sub-pixel R is the smallest, and a size of the green sub-pixel G is centered to facilitate a white balance.

In a conventional display module, a light effect of a front viewing angle can be adjusted by arranging a micro lens array on a light emission side of the display panel. The micro lens array includes a plurality of micro lenses corresponding to the sub-pixels one-to-one. The plurality of micro lenses is arranged above the corresponding sub-pixels. The light effect of a front viewing angle refers to a light output efficiency of a unit area of the display panel in a normal direction of the plane where the display panel is located. Because a micro lens converges a light emitted from the sub-pixels at a large angle to a small angle, an intensity of the emitted light at the large angle is weaker and causes a color shift. An angle of light emitted by the sub-pixel refers to an angle between the light and a normal of the plane where the display panel is located.

Compared with a dimming solution of a micro lens with only one refractive index in a conventional technology, in a technical solution of the embodiments of the present disclosure, the display module is provided with a plurality of first dimming areas A1 and a plurality of second dimming areas A2, both of which include at least one sub-pixel 101. Both the first dimming area A1 and the second dimming area A2 include two dimming layers with different refractive indexes, that is, n1≠n2, n3≠n4. The first dimming area A1 and the second dimming area A2 are both formed by combining two dimming layers with different refractive indexes to form a micro lens structure. While improving the light effect of a front viewing angle of the display module, |n1−n2|, |n3−n4| and an angle of a contact interface relative to the plane where the display panel is located can be set to adjust a reflection ratio and a refraction ratio of the light emitted by the sub-pixels at a contact interface position, thereby improving a weaker brightness in a direction at a large viewing angle, improving a brightness uniformity of the display module, solving a color shift problem of the large viewing angle, and improving a display quality.

Figure 15:
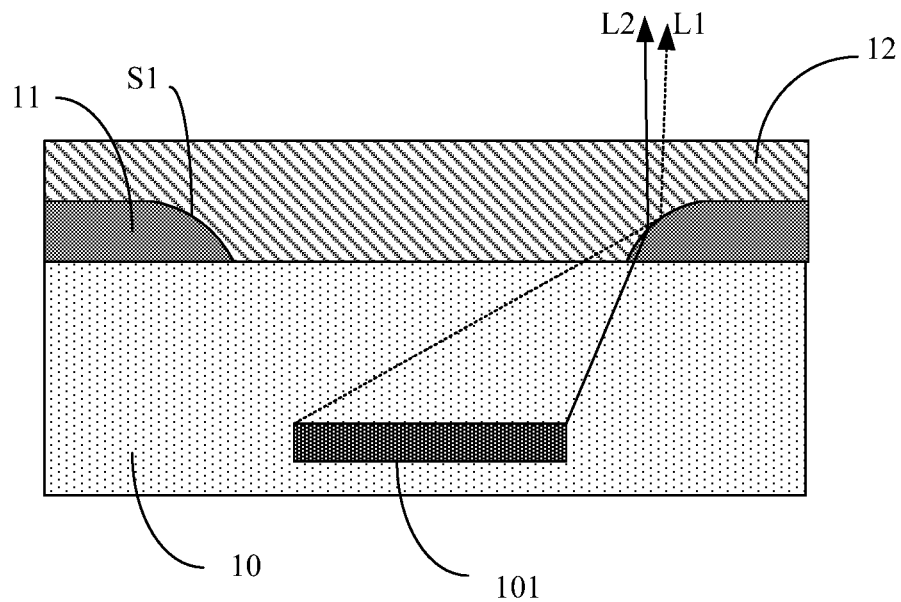
FIG. 15 illustrates a schematic diagram of a dimming principle of a dimming structure in a display module consistent with various embodiments of the present disclosure.

FIG. 15 illustrates a schematic diagram of a dimming principle of a dimming structure in a display module consistent with various embodiments of the present disclosure. The dimming structure has two dimming layers. A dimming layer formed previously has a low refractive index and has a hollowed area opposite to the sub-pixel. A dimming layer formed later has a higher refractive index, filling the hollowed area, and covering the dimming layer formed previously. The dimming structure can be the first dimming structure S10 or the second dimming structure S20 shown in FIGS. 1 and 2. As shown in FIG. 15, the dimming principle of the first dimming structure S10 is used for description. In the first dimming structure S10, the refractive index n1 of the first dimming layer 11 is smaller than the refractive index n2 of the second dimming layer 12. A vertical projection of the hollowed area in the first dimming layer 11 on the display panel 10 covers at least one sub-pixel 101. The contact interface S1 of the first dimming layer 11 and the second dimming layer 12 includes a first dimming structure S10.

As shown in a light path L1 shown by a dashed arrow in FIG. 15, part of the light emitted by the sub-pixel 101 can be reflected at the first dimming structure S10. As shown in a light path L2 illustrated by a dashed arrow in FIG. 15, part of the light emitted by the sub-pixel 101 can be refracted at the first dimming structure S10. Exit directions of the reflected light and the refracted light are different, so changing the refraction ratio and the reflection ratio can adjust an emitted light at a large angle and a light effect of a front viewing angle.

When the angle between the first dimming structure S10 and the plane where the display panel 10 is located is constant, by changing |n1−n2|, the reflection and refraction ratio of the light at a position of the first dimming structure S10 can be adjusted. Similarly, when the angle between the second dimming structure S20 and the plane where the display panel 10 is located is constant, by changing |n3−n4|, the reflection and refraction ratio of the light at the position of the second dimming structure S20 can be adjusted.

Therefore, the technical solution of the present disclosure can ensure the light effect of the front viewing angle through an adjustment layer of different refractive index, and at a same time solve problems of large viewing angle brightness and color shift.

The technical solution of the present disclosure uses a combination of dimming layers with different refractive indexes to make a same dimming structure correspond to a refraction or a reflection. The refraction and the reflection of the dimming structure have different effects on viewing angle characteristics, so as to achieve an effect of optimizing viewing angle characteristics.

Figure 16:
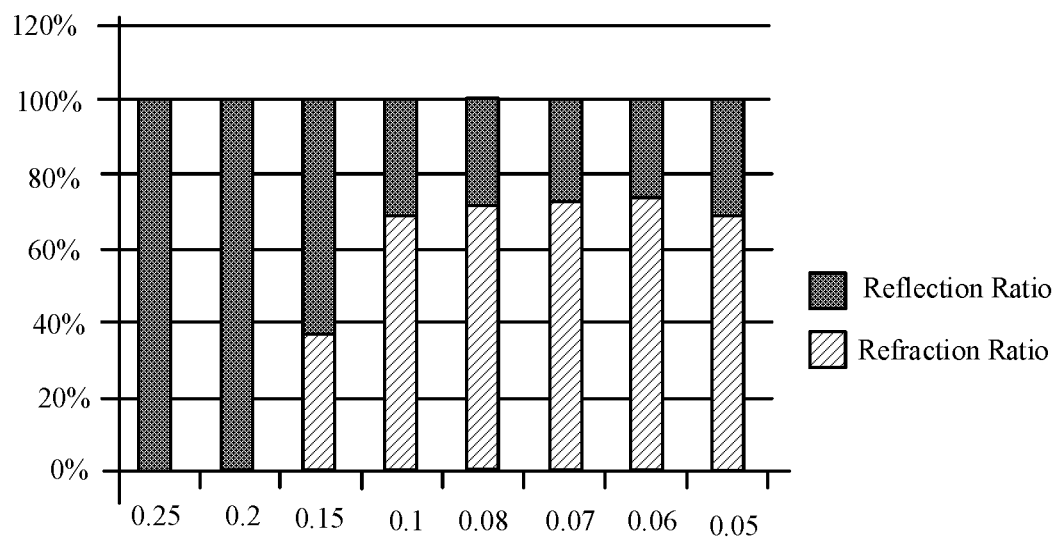
FIG. 16 illustrates a histogram of a refractive index difference and reflection ratio and a refractive index difference and refraction ratio consistent with various embodiments of the present disclosure.

For illustration purposes, the description in FIG. 15 is only based on the dimming structure shown in FIG. 1. A dimming structure of other implementations in the embodiments of the present disclosure can also be equivalent to a reflection and a refraction of light by a contact interface. A principle of adjusting a refraction ratio and a reflection ratio is like an embodiment shown in FIG. 15, which will not be repeated herein. For the dimming structure shown in FIG. 15, a refractive index difference between the two dimming layers and the reflection ratio and refraction ratio are shown in FIG. 16. A relationship between the refractive index difference and the reflection ratio and the refraction ratio of other dimming structures can be determined analogously to an embodiment shown in FIG. 16, which will not be repeated herein.

FIG. 16 illustrates a histogram of a refractive index difference and reflection ratio and a refractive index difference and refraction ratio consistent with various embodiments of the present disclosure consistent with various embodiments of the present disclosure. In FIG. 16, a horizontal axis is an absolute value of a difference between the two dimming layers in a same dimming area. A vertical axis is the refraction ratio and the reflection ratio. Based on FIG. 16, in a same dimming area, when the absolute value of the refractive index difference between the two dimming layers is large, the refraction accounts for a large proportion. Conversely, when the absolute value of the refractive index difference between the two dimming layers is small, the reflection accounts for a large proportion.

Optionally, based on FIG. 16, $|n3-n4|≥0.15$, $|n1-n2|≤0.15$ can be set. In the first dimming area A1, a proportion of refraction is greater than the proportion of reflection in an outgoing light. In the second dimming area, the reflection ratio is greater than the refraction ratio, so that an area dominated by the reflection ratio and an area dominated by the refraction ratio in the display module are mixed to strike a balance between the light effect of the front viewing angle and the brightness of the large viewing angle and ensure the light effect of the front viewing angle, the brightness of the large viewing angle and chromaticity characteristics at a same time.

When the second dimming layer 12 and the fourth dimming layer 14 are made of the same high refractive index material, and the first dimming layer 11 and the third dimming layer 13 are two different low refractive index materials.

Due to factors such as a using or forming process of the display module, light effects of the front viewing angle of the first display area and the second display area of the display module are greatly different, resulting in different brightness of different display areas of the display module. Although a light from different areas of the display array is uniform, due to the factors such as the use of the display module or the forming process or the other factors, a propagation path of the light on the light emission side of the display panel changes, which leads to a large difference between the light effects of the front viewing angle of the first display area and the second display area. In the technical solution of the present disclosure, the above problem can be solved by setting the first dimming area A1 and the second dimming area A2.

In one embodiment, the display module is set to have a first display area and a second display area. In the direction perpendicular to the display panel 10, in the first display area, an area ratio of the first dimming area is greater than an area ratio of the second dimming area, in the second display area, an area ratio of the first dimming area is smaller than an area ratio of the second dimming area, which is used to reduce an absolute value of the difference between the light effects of the front viewing angle of the first display area and the second display area. Since the area ratio of the first dimming area in the first display area is greater than the area ratio of the second dimming area, the refraction ratio is relatively large, which can improve the light effect of the front viewing angle of the first display area. The area ratio of the first dimming area in the second display area is smaller than the area ratio of the second dimming area, so the reflection ratio is relatively large, which can reduce the light effect of the front viewing angle of the second display area. Therefore, embodiments of the present disclosure provide solutions to solve the problem that the light effect of the front viewing angle of the first display area is less than the light effect of the front viewing angle of the second display area, reduce the absolute value of the difference between the light effects of the front viewing angle, and improve a brightness uniformity of the entire display module.

Figure 17:
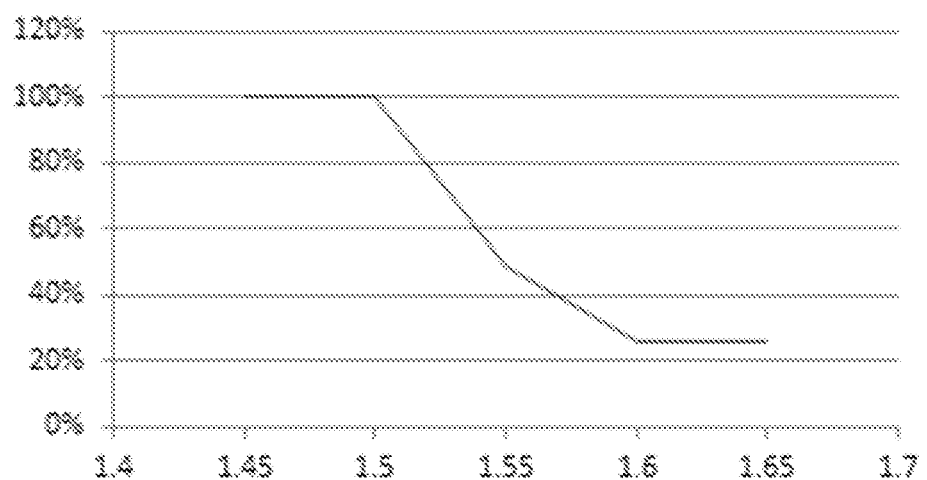
FIG. 17 illustrates a curve diagram of a refraction ratio and reflection ratio of a dimming layer with a lower refractive index in a dimming structure.

FIG. 17 illustrates a curve diagram of a refraction ratio and a reflection ratio of a dimming layer with a lower refractive index in a dimming structure. In FIG. 17, a horizontal axis is the refractive index, and a vertical axis is the reflection ratio. It can be seen from FIG. 17 that for the dimming structure shown in FIG. 15, if the refractive index of the dimming layer with a higher refractive index is constant, in a certain range of the refractive index of the dimming layer with a lower refractive index, as the refractive index increases, the reflection ratio decreases, and the corresponding refraction ratio increases. That is, the smaller the refractive index difference of the dimming layer with a higher refractive index, the larger the refraction ratio, which is consistent with a result of the histogram shown in FIG. 16. A relationship between the refraction ratio and the reflection ratio of the dimming layer with a lower refractive index in other dimming structures can be determined analogously to the embodiment shown in FIG. 17.

Figure 18:
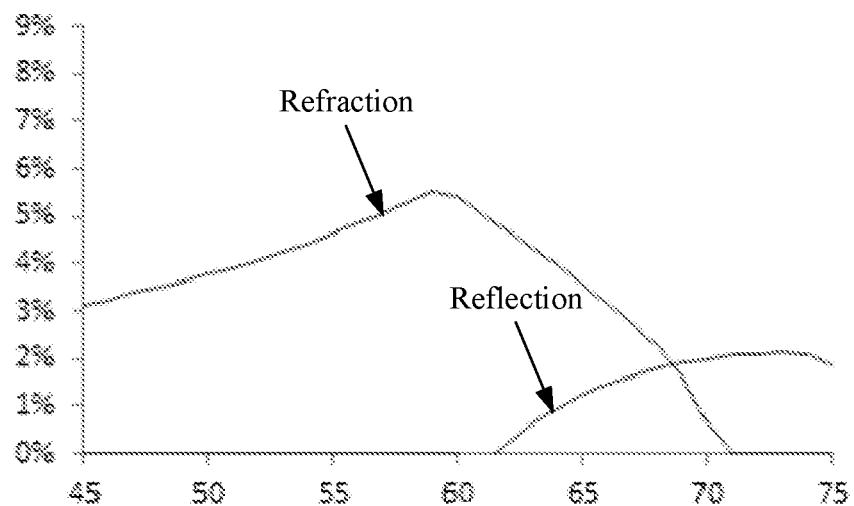
FIG. 18 illustrates a curve diagram of an angle between a dimming structure and a plane where a display panel is located and a light effect of a front viewing angle consistent with various embodiments of the present disclosure.

FIG. 18 illustrated a relationship between the angle between the dimming structure shown in FIG. 15 and the plane where the display panel 10 is located and the front viewing angle. A relationship between the angle between other dimming structures and the plane where the display panel 10 is located and the front viewing angle can be determined analogously to an embodiment shown in FIG. 18.

FIG. 18 illustrates a curve diagram of an angle between a dimming structure and a plane where a display panel is located and a light effect of a front viewing angle consistent with various embodiments of the present disclosure. A horizontal axis is an angle. A vertical axis is an improvement percentage of the light effect of the front viewing angle. Based on FIG. 18, for a same dimming structure, when the angle is small, such as less than 60°, since an inclination angle of a corresponding contact interface relative to the plane where the display panel 10 is located is relatively small, a light emitted by the sub-pixels at a large angle can be refracted at a contact interface position and cannot be reflected. Therefore, a refraction is mainly related to an improvement of the light effect of the front viewing angle. When an included angle between the dimming structure and the plane where the display panel 10 is located is large, such as not less than 60°, a contact interface corresponding to the dimming structure has both reflection and refraction.

Therefore, in one embodiment, both the angle between the first dimming structure S10 and the plane of the display panel 10 and the angle between the second dimming structure S20 and the plane of the display panel 10 are set to not less than 60°, so that an emitted light in the dimming structure has both emission and refraction. When the angle is set to be greater than 60° and less than 70°, both reflection and refraction exist in the dimming structure. Different degrees of influence of refraction and reflection on a viewing angle characteristic can be used to optimize the viewing angle characteristics.

Figure 19:
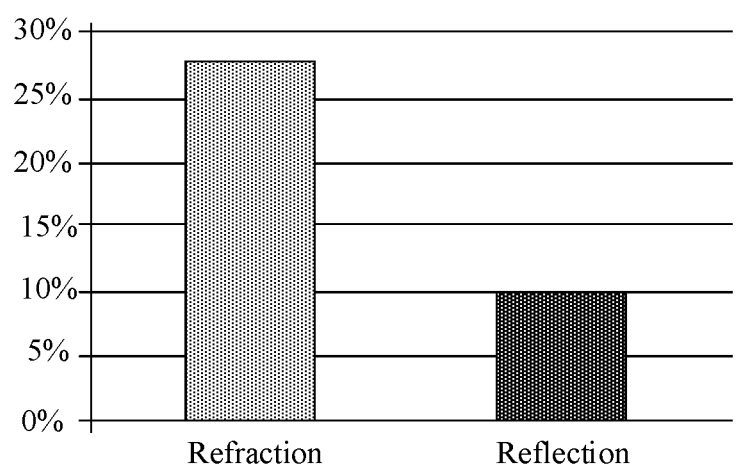
FIG. 19 illustrates a histogram of refraction on an improvement of a light effect of a front viewing angle and reflection on an improvement of a light effect of a front viewing angle in a dimming structure consistent with various embodiments of the present disclosure.

A relationship between the refraction and reflection of the dimming structure shown in FIG. 15 to improve the light effect of the front viewing angle is shown in FIG. 19. A relationship between the refraction and reflection of other dimming structures to improve the light effect of the front viewing angle can be determined analogously to the embodiment shown in FIG. 19.

FIG. 19 illustrates a histogram of refraction on an improvement of a light effect of a front viewing angle and reflection on an improvement of a light effect of a front viewing angle in a dimming structure consistent with various embodiments of the present disclosure. Based on FIG. 19, refraction effect on the improvement of the light effect of the front viewing angle is greater than reflection effect on the improvement of the light effect of the front viewing angle. In one embodiment, the light effect of the front viewing angle of the corresponding display area can be improved through a dimming structure with a high refraction ratio.

Based on FIG. 18, when the included angle between the dimming structure and the plane where the display panel 10 is located is within a certain range, as the included angle decreases, a refraction effect becomes clearer. Based on FIG. 19, the improvement of the light effect of the front viewing angle by refraction is greater than the improvement of the light effect of the front viewing angle by reflection. In one embodiment, when the angle between the first dimming structure S10 and the plane where the display panel 10 is located is smaller, and the refraction effect is clear, |n1−n2| is set to be larger to increase the reflection ratio of the first dimming structure S10. When the angle between the second dimming structure S20 and the plane where the display panel 10 is located is smaller, and the refraction effect is clear, |n3−n4| is set to be larger to increase the reflection ratio of the second dimming structure S20. Therefore, the dimming structure has both reflection and refraction to ensure a uniformity of light brightness.

Figure 20:
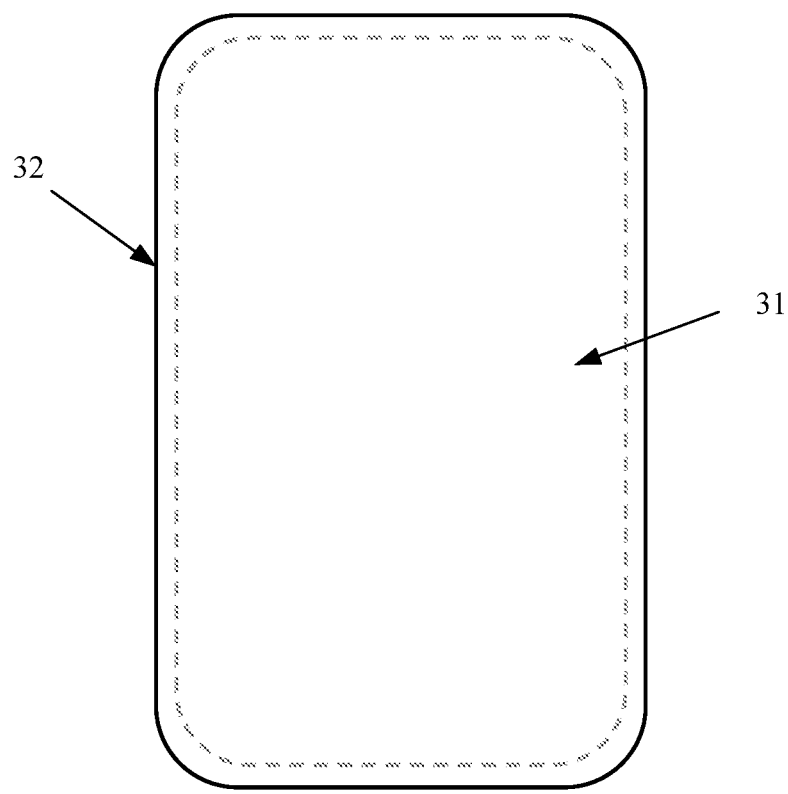
FIG. 20 illustrates a top view of a display module consistent with various embodiments of the present disclosure.

FIG. 20 illustrates a top view of a display module consistent with various embodiments of the present disclosure. With reference to a cross-sectional view of the display module in the above embodiment, as shown in FIG. 20, the display module has a first display area 31 and a second display area 32. The second display area 32 surrounds the first display area 31. A sub-pixel density in the first display area 31 and a sub-pixel density in the second display 32 are same. In the direction perpendicular to the plane where the display panel 10 is located, the first display area 31 is in the first dimming area without overlapping with the second dimming area. The second display area 32 is in the second dimming area without overlapping with the first dimming area. As shown in FIG. 20, the display module only has one first dimming area and one second dimming area.

In a conventional display module, due to factors such as a forming process, a plastic encapsulation structure on a light emission side of the display panel has a poor flatness in a position corresponding to the second display area relative to a position corresponding to the first display area. For an organic plastic encapsulation layer with a large middle layer thickness of a plastic encapsulation structure, a flatness of an area around an edge of the plastic encapsulation layer is greatly affected by a process error, resulting in a poor flatness of the area around the edge of the plastic encapsulation layer, making the display module have a light leakage problem in the second display area. The light effect of the front viewing angle of the first display area is smaller than the light effect of the front viewing angle of the second display area, so that brightness of the first display area and the second display area is relatively small. There is a large brightness difference between the two display areas.

Through a solution shown in FIG. 20, the above edge light leakage problem can be solved. In the direction perpendicular to the plane where the display panel 10 is located, the first display area 31 is in the first dimming area and has no overlap with the second dimming area. The second display area 32 is in the second dimming area and has no overlap with the first dimming area. The refraction ratio in the first display area 31 is relatively large, which can improve the light effect of the front viewing angle, the reflection ratio in the second display area 32 is relatively large, which can reduce the light effect of the front viewing angle, thereby solving a problem of a large difference between the light effects of the first display area 31 and the second display area 32 of the front viewing angle.

Figure 21:
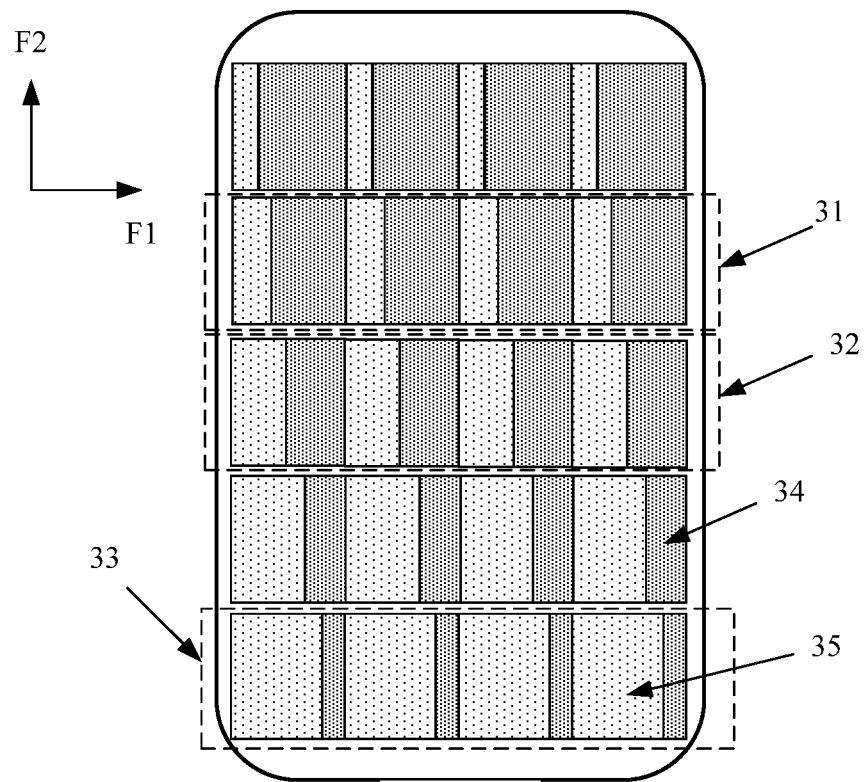
FIG. 21 illustrates a top view of another display module consistent with various embodiments of the present disclosure.

FIG. 21 illustrates a top view of another display module consistent with various embodiments of the present disclosure. With reference to a cross-sectional view of the display module in the above embodiment, as shown in FIG. 21, the display module has a first display area 31 and a second display area 32. The display panel 10 has opposite first and second ends. A distance between the first end and a display driving chip IC is smaller than a distance between the second end and the display driving chip IC. The second display area 32 is located between the first display area 31 and the display driving chip IC. In a third direction F2, the display module has a plurality of display subareas 33 arranged in sequence. The first display area 31 and the second display area 32 are any two adjacent display subarea 33. The third direction F2 points from the first end to the second end. The display subarea 33 corresponds to a plurality of first dimming areas 34 and a plurality of second dimming areas 35 alternately arranged in a fourth direction F1. The fourth direction F1 is perpendicular to the third direction F2, and both the third direction F2 and the fourth direction F1 are parallel to the plane where the display panel 10 is located. In the third direction F2, an area of the first dimming area 34 in the different display subareas 33 gradually increases.

In a conventional display module, since the sub-pixel 101 far away from the display driver IC requires a longer line to connect to the display driver IC, compared with the sub-pixel 101 close to the display driver IC, the sub-pixel 101 far away from the display driver IC has a larger line impedance. Therefore, under a same driving voltage/current, a brightness of the sub-pixel 101 far away from the display driver IC is lower. As shown in FIG. 21, in the third direction F2, an area ratio of the first dimming area 34 in the different display zones 33 gradually increases. Therefore, the display subarea 33 far away from the display driver IC has a relatively large refraction ratio, which can improve the light effect of the front viewing angle, reduce a difference from the light effect of viewing angle in the display subarea 33 close to the display driver IC, and improve a brightness uniformity.

As shown in FIG. 21, in a same display subarea 33, areas of the first dimming areas 34 can be set to be same, and areas of the second dimming areas 35 can be set to be same. In the third direction F2, the area of the first dimming area 34 gradually increases, and the area of the second dimming area 35 gradually decreases in the different display subareas 33. while solving a problem of an uneven display brightness caused by line impedance, it is convenient to arrange and layout the first dimming area 34 and the second dimming area 35 in each display subarea 33 to simplify a forming process.

Figure 22:
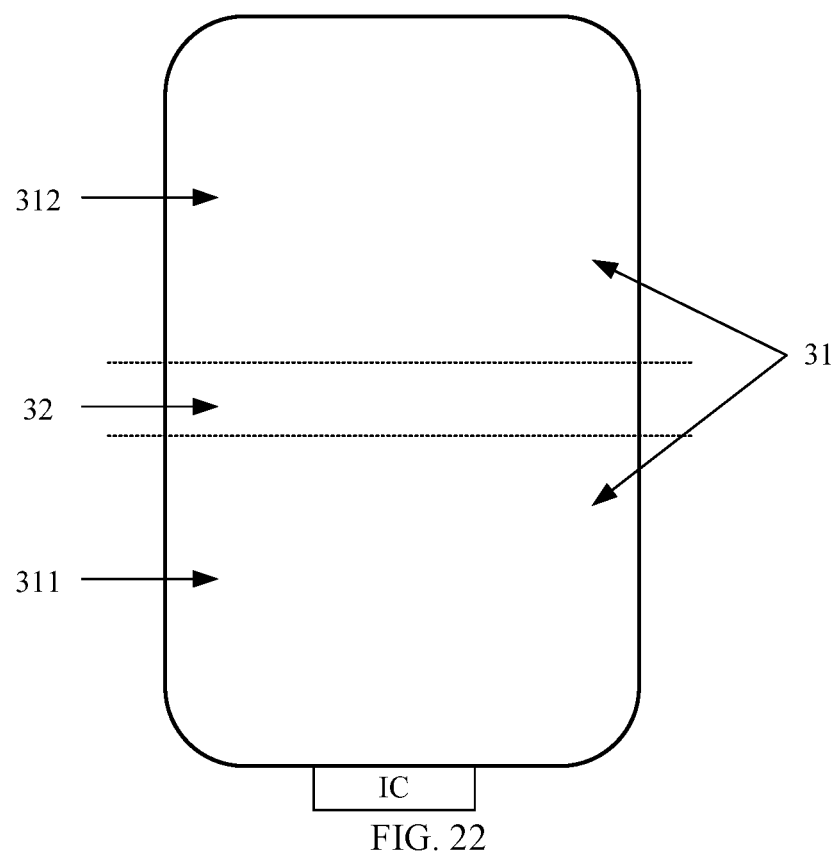
FIG. 22 illustrates a top view of another display module consistent with various embodiments of the present disclosure.

FIG. 22 illustrates a top view of another display module consistent with various embodiments of the present disclosure. With reference to a cross-sectional view of the display module in the above embodiment, as shown in FIG. 22, the display module has the first display area 31 and the second display area 32. The display module is a bendable display module. The second display area 32 is a bendable display portion. The first display area 31 includes two flat display portions located on both sides of the bendable display portion. The two flat display portions are respectively a first flat display part 311 and a second flat display part 312. When the display module is in a flat state, the first display area 31 is in the first dimming area and the second display area 32 is located in the second dimming area in the direction perpendicular to the plane of the display panel 10. As shown in FIG. 22, one first dimming area is set, and two second dimming areas are set on both sides of the first dimming area.

In a conventional bendable display module, a flatness of the second display area 32 is deteriorated due to bending deformation, making a display brightness of the second display area 32 larger than a display brightness of the first display area 31. A brightness difference caused by bending is far greater than a brightness difference caused by line impedance. A solution shown in FIG. 22 can solve the brightness differences caused by bending. As shown in FIG. 22, when the display module is in a flat state, in the direction perpendicular to the plane where the display panel 10 is located, the first display area 31 is in the first dimming area and the second display area 32 is in the second dimming area. The refraction ratio in the first display area 31 is relatively large, which can improve the light effect at the front viewing angle, and the reflection ratio in the second display area 32 is relatively large, which can reduce the light effect of the front viewing angle, thereby reducing a difference between the light effect of the front viewing angle of the first display area 31 and the light effect of the front viewing angle of the second display area 32 and improving a brightness uniformity.

Figure 23:
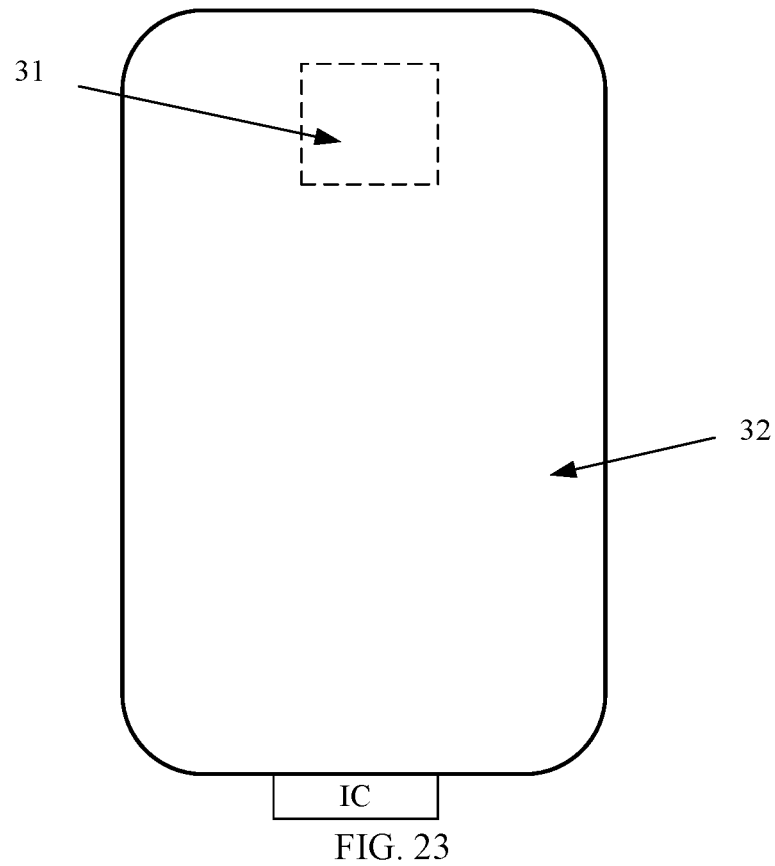
FIG. 23 illustrates a top view of another display module consistent with various embodiments of the present disclosure.

FIG. 23 illustrates a top view of another display module consistent with various embodiments of the present disclosure. With reference to a cross-sectional view of the display module in the above embodiment, as shown in FIG. 23, the display module has the first display area 31 and the second display area 32. A density of sub-pixels in the first display area 31 is less than a density of sub-pixels in the second display area 32. The second display area 32 surrounds at least part of the first display area 31. In the direction perpendicular to the display panel 10, the first display area 31 is in the first dimming area, and the second display area 32 is in the second dimming area. A first dimming area and a second dimming area are set in the display module.

In a conventional full-screen display module, a display area corresponding to a camera under a screen is the first display area 31. The other display area is the second display area 32. To ensure sufficient lighting for the camera for imaging, the density of sub-pixels in the first display area 31 needs to be set to be smaller than the density of sub-pixels in the second display area 32, which results in a lower light effect of the front viewing angle of the first display area 31. A solution shown in FIG. 23 can solve the above problem. As shown in FIG. 23, in the direction perpendicular to the plane where the display panel 10 is located, the first display area 31 is in the first dimming area and the second display area 32 is in the second dimming area. The refraction ratio in the first display area 31 is relatively large, which can improve the light effect of the front viewing angle, and the reflection ratio in the second display area 32 is relatively large, which can reduce the light effect of the front viewing angle, thereby reducing a difference between the light effect of the front viewing angle of the first display area 31 and the light effect of the front viewing angle of the second display area 32 and improving a brightness uniformity.

Figure 24:
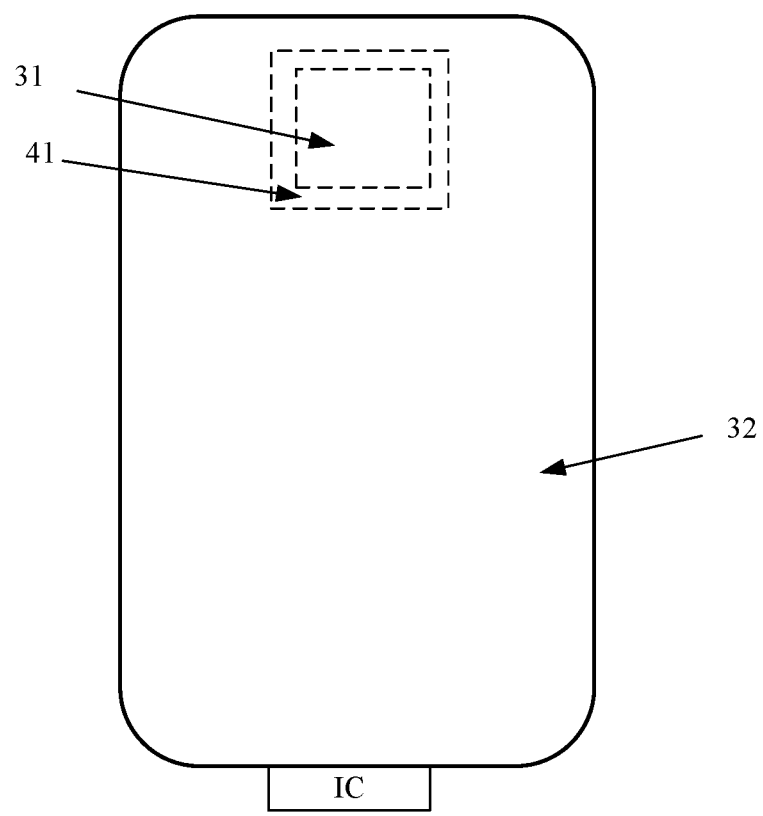
FIG. 24 illustrates a top view of another display module consistent with various embodiments of the present disclosure.

FIG. 24 illustrates a top view of another display module consistent with various embodiments of the present disclosure. With reference to a cross-sectional view of the display module in the above embodiment, as shown in FIG. 24, the display module has a third display area 41 located between the first display area 31 and the second display 32. In a direction in which the first display area 31 points to the second display area 32, the third display area 41 has alternately distributed third areas and fourth areas. The third area 41 has at least one first dimming structure S10, and the fourth area has at least one second dimming structure S20.

Figure 25:
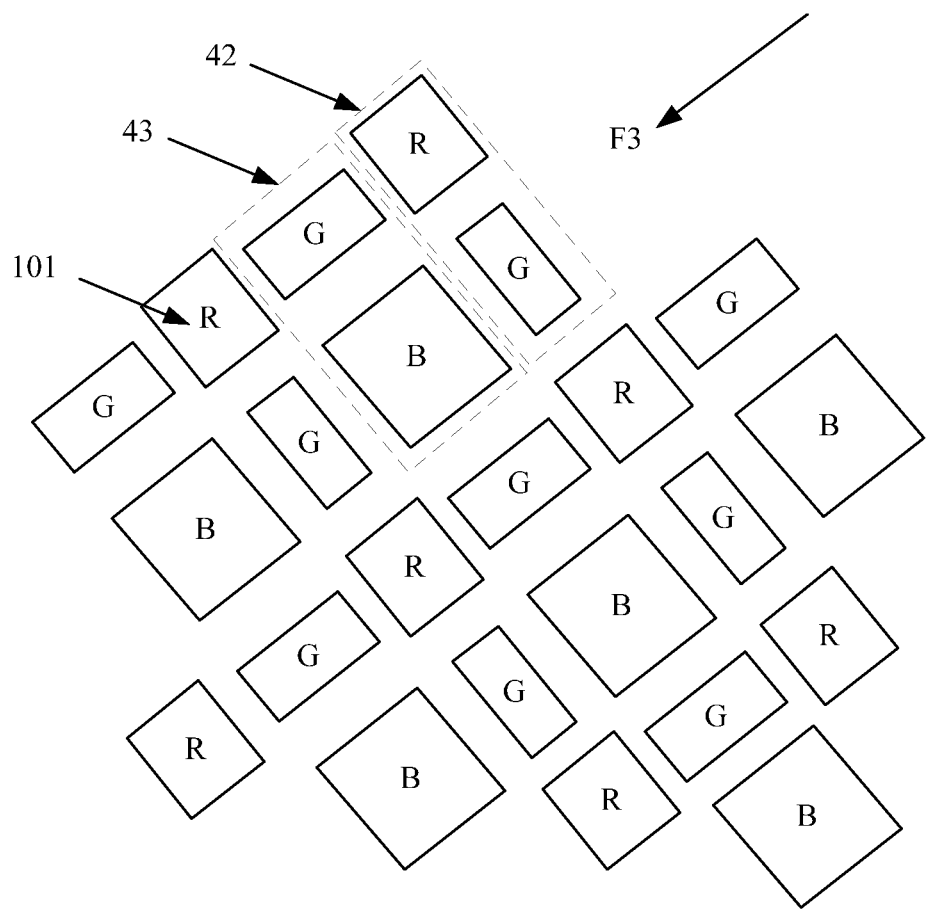
FIG. 25 illustrates a schematic diagram of an arrangement of sub-pixels in a third display area consistent with various embodiments of the present disclosure.

FIG. 25 illustrates a schematic diagram of an arrangement of sub-pixels in a third display area consistent with various embodiments of the present disclosure. With reference to FIGS. 24 and 25, in the direction F3 in which the first display area 31 points to the second display area 32, the third display area 41 has alternately distributed third areas 42 and fourth areas 43. The third area 41 has at least one first dimming structure S10, and the fourth area has at least one second dimming structure S20. The third area 42 and the fourth area 43 alternately arranged in the direction F3 are arranged in a transition area between the first display area 31 and the second display area 32, so that the dimming layers with different refractive indexs are alternately arranged to improve a brightness uniformity.

In one embodiment, in the first dimming layer 11 and the second dimming layer 12, a material of one of the two dimming layers with a lower refractive index is acrylic or silicone, and a material of one of the two dimming layers with a higher refractive index is ink mixed with a surface dispersant and doped particles. In the third dimming layer 13 and the fourth dimming layer 14, a material of one of the two dimming layers with a lower refractive index is acrylic or silicone, and a material of one of the two dimming layers with a higher refractive index is ink mixed with a surface dispersant and doped particles. The surface dispersant is at least one of sodium tripolyphosphate, sodium hexametaphosphate, sodium pyrophosphate and water glass. The doped particles are nanoparticles, such as zirconium oxide ($ZrO_2$). Materials used in the dimming layer are all materials with a good light permeability. A refractive index can be adjusted through material components in a material, which is convenient for the selection and use of different refractive indexes.

In one embodiment, since $|n1-n2|<|n3-n4|$, the refraction ratio of the first dimming structure S10 is greater than the reflection ratio of the first dimming structure S10. The reflection ratio is relatively small. To make the first dimming structure S10 reflect and refract at intervals, a minimum distance d1 between the contact interface S1 and the sub-pixels 101 in the first dimming area in the fifth direction F4 is set to be greater than a minimum distance d2 of the contact interface S2 and the sub-pixels in the second dimming area in the fifth direction F4 to increase a reflection of the contact interface S1. The fifth direction F4 is parallel to the plane where the display panel 10 is located, and points to the sub-pixels 101 from a contact interface.

Figure 26:
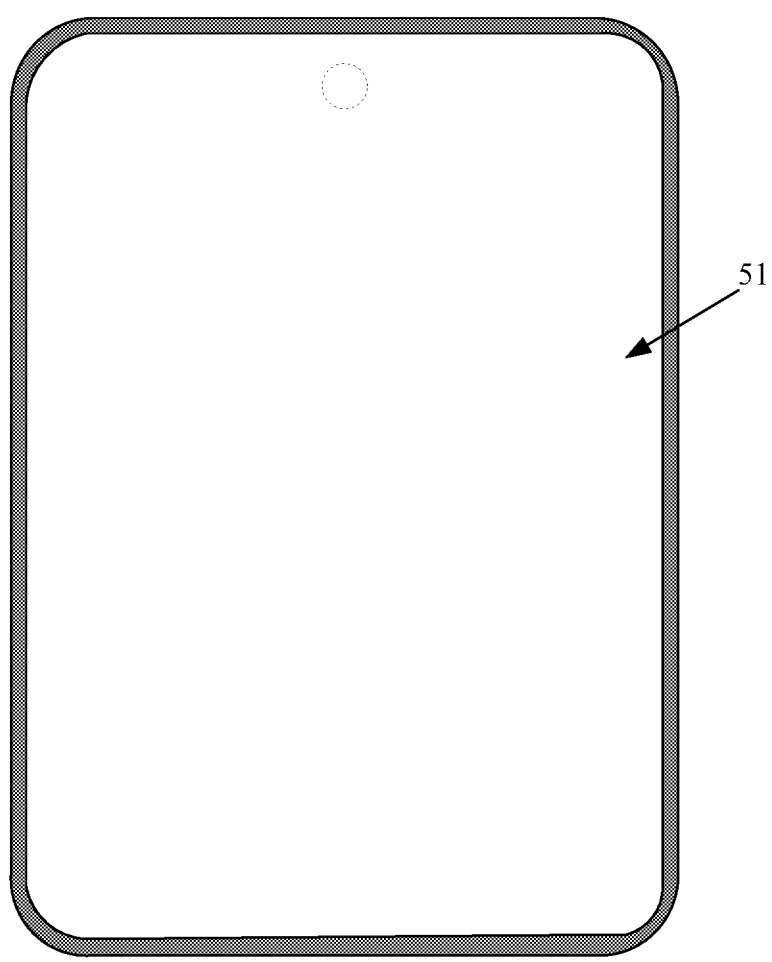
FIG. 26 illustrates a schematic diagram of a display device consistent with various embodiments of the present disclosure.

Based on the above embodiments, another embodiment of the present disclosure also provides a display device. FIG. 26 illustrates a schematic diagram of a display device consistent with various embodiments of the present disclosure. The display device includes a display module 51, which may be the display module provided in the above embodiments.

The display device can be a mobile phone, a tablet computer, a notebook computer, or a wearable device with a display function. The display device adopts the above display module, which has a good brightness uniformity.

The various embodiments in the specification are described in a progressive, or parallel, or a combination of progressive and parallel. Each embodiment focuses on differences from other embodiments. Same and similar parts between the various embodiments can be referred to each other. Since the display device disclosed in the embodiments correspond to the touch module disclosed in the embodiments of the present disclosure, the description of the display device is relatively simple. Descriptions of corresponding part(s) of the touch module can be referred for related information.

It should be noted that, in the description of the present disclosure, it should be understood that the terms "upper", "lower", "top", "bottom", "inner", "outer" and other directions or positional relationships are based on directions or positional relationships shown in the accompanying drawings is only for a convenience of describing the present disclosure and simplifying the description, and does not indicate or imply that the device or element referred to must have a specific direction, be constructed and operated in a specific direction, and therefore cannot be understood as restrictions on the present disclosure. When a component is "connected" to another component, the component can be directly connected to another component or with an intermediate component.

It should also be noted that in the present specification, relational terms such as first and second are only used to distinguish one entity or operation from another entity or operation, and do not necessarily require or imply that there is any such actual relationship or order between these entities or operations. Moreover, the terms "include", "comprise" or any other variations thereof are intended to cover non-exclusive inclusion, so that items or equipment including a series of elements includes not only the series of elements, but also other elements that are not explicitly listed or elements inherent to such items or equipment. If there are no more restrictions, an element defined by a sentence "including a . . . " does not exclude an existence of other identical elements in the items or equipment that includes the above elements.

The above description of the disclosed embodiments enables those skilled in the art to implement or use the present disclosure. Various modifications to these embodiments will be obvious to those skilled in the art. General principles defined herein can be implemented in other embodiments without departing from the spirit or scope of the present disclosure. Therefore, the present disclosure is not limited to the embodiments shown in the specification but should conform to a widest scope consistent with the principles and novel features disclosed in the specification.

What is claimed is:

1. A display module, comprising:
a display panel including a display array, the display array including a plurality of sub-pixels with pixel gaps between adjacent sub-pixels; and
first dimming areas and second dimming areas, both a first dimming area of the first dimming areas and a second dimming area of the second dimming areas including at least one of the plurality of sub-pixels, wherein:
the first dimming area includes a first dimming layer with a refractive index of n1, a second dimming layer with a refractive index of n2, a contact interface between the first dimming layer and the second dimming layer includes a first dimming structure,
the second dimming area includes a third dimming layer with a refractive index of n3, and a fourth dimming layer with a refractive index of n4, a contact interface between the third dimming layer and the fourth dimming layer includes a second dimming structure,
an angle between the first dimming structure and a plane where the display panel is located is less than 90°, an angle between the second dimming structure and the plane where the display panel is located is less than 90°, and $|n1-n2|<|n3-n4|$, and
the display module further comprises a first display area and a second display area, wherein:
in a direction perpendicular to the display panel, in the first display area, an area ratio of the first dimming area is greater than an area ratio of the second dimming area, and in the second display area, an area ratio of the first dimming area is smaller than the area ratio of the second dimming area.

2. The display module according to claim 1, wherein:
the display array includes a sub-display array, the sub-display array includes a plurality of first sub-pixel groups and a plurality of second sub-pixel groups arranged alternately in a first direction, the first sub-pixel group and the second sub-pixel group both include at least one of the plurality of sub-pixels, and the first direction is parallel to the plane where the display panel is located;
in a direction perpendicular to the plane where the display panel is located, each of the plurality of first sub-pixel groups corresponds to one of the first dimming areas, and each of the plurality of second sub-pixel groups corresponds to one of the second dimming areas; and
in the direction perpendicular to the plane where the display panel is located, a first sub-pixel group of the plurality of first sub-pixel groups is in the corresponding first dimming area, and a second sub-pixel group of the plurality of second sub-pixel groups is in the corresponding second dimming area.

3. The display module according to claim 2, wherein the display array includes a plurality of the sub-display arrays sequentially arranged in a second direction, the second direction being perpendicular to the first direction and parallel to the plane where the display panel is located.

4. The display module according to claim 2, wherein each of the first sub-pixel group and the second sub-pixel group includes at least one pixel unit, the pixel unit includes a plurality of the sub-pixels with different colors, and number of the plurality of sub-pixels and arrangement of the plurality of sub-pixels in the first sub-pixel group and in the second sub-pixel group are same.

5. The display module according to claim 2, wherein at least one of number of the plurality of sub-pixels and arrangement of the plurality of sub-pixels in the first sub-pixel group and the second sub-pixel group is different.

6. The display module according to claim 1, wherein:
the second display area surrounds the first display area, and sub-pixel densities in the first display area and the second display are same; and
in the direction perpendicular to the plane where the display panel is located, the first display area is in the first dimming area without overlapping with the second dimming area, and the second display area is in the second dimming area without overlapping with the first dimming area.

7. The display module according to claim 1, comprising a first end and a second end opposite to each other, wherein:
a distance between the first end and a display driving chip is smaller than a distance between the second end and the display driving chip;
the second display area is located between the first display area and the display driving chip;
in a third direction, the display panel has a plurality of display subareas arranged in sequence, the first display area and the second display area are any two adjacent display subareas, and the third direction is from the first end to the second end;
the display area corresponds to a plurality of the first dimming areas and a plurality of the second dimming areas alternately arranged in a fourth direction;
the fourth direction is perpendicular to the third direction; and
a proportion of an area of the first dimming area in different display subareas gradually increases along the third direction.

8. The display module according to claim 7, wherein:
in a same sub-display area, areas of the first dimming areas are same, and areas of the second dimming areas are same; and
the areas of the first dimming areas in the different display subareas gradually increase along the third direction, and the areas of the second dimming areas in the different display subareas gradually decrease along the third direction.

9. The display module according to claim 1, wherein:
the display module is a bendable display module, the second display area is a bendable display portion, the first display area includes two flat display portions located on both sides of the bendable display portion; and
when the display module is in a flat state, in the direction perpendicular to the plane where the display panel is located, the first display area is in the first dimming area, and the second display area is in the second dimming area.

10. The display module according to claim 1, wherein a density of the plurality of sub-pixels in the first display area is less than a density of the plurality of sub-pixels in the second display area, and the second display area surrounds at least part of the first display area; and in the direction perpendicular to the display panel, the first display area is in the first dimming area, and the second display area is in the second dimming area.

11. The display module according to claim 1, wherein:
the first dimming layer and the third dimming layer are in a same layer including a first layer, wherein both the first dimming layer and the third dimming layer are in the first layer, and the first layer includes hollowed areas and non-hollowed areas; and
the second dimming layer and the fourth dimming layer are in a same layer including a second layer, both the second dimming layer and the fourth dimming layer are in the second layer, the second layer fills the hollowed area and covers a surface of the first layer facing away from the display panel.

12. The display module according to claim 11, wherein:
the first layer has a plurality of the hollowed areas, and a vertical projection of a hollowed area of the plurality of the hollowed areas on the display panel covers at least one of the plurality of sub-pixels; and
a refractive index n1 of the first dimming layer is less than a refractive index n2 of the second dimming layer, and a refractive index n3 of the third dimming layer is less than a refractive index n4 of the fourth dimming layer.

13. The display module according to claim 12, wherein the plurality of the hollowed areas in the first layer one-to-one corresponds to the plurality of sub-pixels, and the vertical projection of the hollowed area of the plurality of the hollowed areas on the display panel covers a corresponding sub-pixel of the plurality of sub-pixels.

14. The display module according to claim 11, wherein:
the first layer has a plurality of the non-hollowed areas, and a vertical projection of a non-hollowed area the plurality of the non-hollowed areas on the display panel covers at least one of the plurality of sub-pixels; and
the refractive index n1 of the first dimming layer is less than the refractive index n2 of the second dimming layer; and the refractive index n3 of the third dimming layer is less than the refractive index n4 of the fourth dimming layer; or
the refractive index n1 of the first dimming layer is greater than the refractive index n2 of the second dimming layer; the refractive index n3 of the third dimming layer is greater than the refractive index n4 of the fourth dimming layer.

15. The display module according to claim 1, wherein:
a minimum distance between a contact interface and the sub-pixel of the plurality of sub-pixels in the first dimming area in a fifth direction is greater than a minimum distance between the contact interface and the sub-pixel of the plurality of sub-pixels in the second dimming area in the fifth direction; and
the fifth direction is parallel to the plane where the display panel is located, pointing to the sub-pixel of the plurality of sub-pixels from the contact interface.

16. The display module according to claim 1, wherein:
as the angle between the first dimming structure and the plane where the display panel is located decreases, the $|n1-n2|$ increases; and
as the angle between the second dimming structure and the plane where the display panel is located decreases, the $|n3-n4|$ increases.

17. The display module according to claim 1, wherein $|n3-n4| \geq 0.15$, and $|n1-n2| \leq 0.15$.

18. The display module according to claim 1, wherein:
the angle between the first dimming structure and the plane where the display panel is located is not less than 60°; and
the angle between the second dimming structure and the plane where the display panel is located is not less than 60°.

19. A display device, comprising a display module, wherein the display module comprises:
a display panel including a display array, the display array including a plurality of sub-pixels with pixel gaps between adjacent sub-pixels; and
first dimming areas and second dimming areas, both a first dimming area of the first dimming areas and a second dimming area of the second dimming areas including at least one of the plurality of sub-pixels, wherein:
the first dimming area includes a first dimming layer with a refractive index of n1, a second dimming layer with a refractive index of n2, a contact interface between the first dimming layer and the second dimming layer includes a first dimming structure,
the second dimming area includes a third dimming layer with a refractive index of n3, and a fourth dimming layer with a refractive index of n4, a contact interface between the third dimming layer and the fourth dimming layer includes a second dimming structure,
an angle between the first dimming structure and a plane where the display panel is located is less than 90°, an angle between the second dimming structure and the plane where the display panel is located is less than 90°, and $|n1-n2|<|n3-n4|$, and
the display module further comprises a first display area and a second display area, wherein:
in a direction perpendicular to the display panel, in the first display area, an area ratio of the first dimming area is greater than an area ratio of the second dimming area, and in the second display area, an area ratio of the first dimming area is smaller than the area ratio of the second dimming area.

* * * * *